United States Patent
Kern et al.

(10) Patent No.: US 12,414,274 B2
(45) Date of Patent: Sep. 9, 2025

(54) MEASURING UTILIZATION TO ADJUST WATER FLOW FOR COOLING OF SERVERS AND SERVER COMPONENTS

(71) Applicant: Lenovo Enterprise Solutions (Singapore) Pte. Ltd., New Tech Park (SG)

(72) Inventors: Eric R Kern, Chapel Hill, NC (US); Paola Martinez Morales, Wendell, NC (US); Jerrod K Buterbaugh, Wake Forest, NC (US); Florin Cazacu, Balotesti (RO); Fadel Matar, Ottawa (CA)

(73) Assignee: Lenovo Enterprise Solutions (Singapore) Pte. Ltd., New Tech Park (SG)

( * ) Notice: Subject to any disclaimer, the term of this patent is extended or adjusted under 35 U.S.C. 154(b) by 233 days.

(21) Appl. No.: 18/129,499

(22) Filed: Mar. 31, 2023

(65) Prior Publication Data
US 2024/0334658 A1  Oct. 3, 2024

(51) Int. Cl.
*H05K 7/20* (2006.01)
(52) U.S. Cl.
CPC ..... *H05K 7/20836* (2013.01); *H05K 7/20772* (2013.01)
(58) Field of Classification Search
CPC ........... H05K 7/20836; H05K 7/20772
See application file for complete search history.

(56) References Cited

U.S. PATENT DOCUMENTS

2020/0100394 A1* 3/2020 Albinger ................. F24F 11/47

FOREIGN PATENT DOCUMENTS

JP 2012098916 A * 5/2012

OTHER PUBLICATIONS

Lazic et al., "Data center cooling using model-predictive control", NeurIPS 2018, date known about Nov. 29, 2022, pp. 1-10.
Baojun et al., "Temperature prediction and cooling structure optimization of explosion-proof high pressure water-cooled double speed motor", Elsevier, date published Feb. 23, 2022, pp. 1-11.
(Continued)

*Primary Examiner* — Emmanuel E Duke
(74) *Attorney, Agent, or Firm* — Kunzler Bean & Adamson; Bruce R. Needham

(57) ABSTRACT

A method for measuring utilization to adjust water flow for cooling of servers and server components includes determining a utilization of a server. The server is water-cooled and includes one of a plurality of servers. Each server of the plurality of servers is water-cooled, and each server of the plurality of servers is connected to a water supply manifold by one or more valves. The method also includes determining, based at least in part on the determined utilization of the server, a water flow rate to cool the server. The method includes adjusting, based at least in part on the determined water flow rate to cool the server, a water flow rate to the server via a valve controlling the water flow rate to the server.

20 Claims, 9 Drawing Sheets

(56) References Cited

OTHER PUBLICATIONS

Lingling et al., "The Research of Cooling Water Temperature and Flow Rate Control System Based on Heat Transfer and Neural Network", IEEE 2015 5th International Conference on Instrumentation and Measurement, Computer, Communication and Control (IMCCC), Sep. 18-20, 2015, p. 1.

Acun et al., "Support for Power Efficient Proactive Cooling Mechanisms", IEEE 2017 24th International Conference on High Performance Computing (HiPC), Dec. 18-21, 2017, p. 1.

Mcevoy et al., "Adaptive Liquid Cooling Methods in Microchannel", ESIPP Dept. of Mechanical & Manufacturing Engineering, pp. 1-6.

Nisa et al., "Comparative Assessment to Predict and Forecast Water-Cooled Chiller Power Consumption Using Machine Learning and Deep Learning Algorithms", MDPI Sustainability 2021, Jan. 14, 2021, pp. 1-18.

Wang et al., "Development of supervisory control strategy for online control of central cooling water systems", ResearchGate International Building Performance Simulation Association 2007, Jan. 2007, pp. 1-9.

\* cited by examiner

MEASURING UTILIZATION TO ADJUST WATER FLOW FOR COOLING OF SERVERS AND SERVER COMPONENTS

FIELD

The subject matter disclosed herein relates to cooling of computing equipment and more particularly relates to measuring utilization to adjust water flow for cooling of servers and server components.

BACKGROUND

Liquid cooling is often used for computing equipment. Over time, servers and other computing equipment have evolved to provide increased performance. In addition, density of computing equipment has increased in datacenters and other areas with computing equipment, which increases heat load and results in higher flow rates. Datacenters often include rack-mounted trays of computing equipment. Each of these racks require different flow rates, and these required flow rates can change over time.

BRIEF SUMMARY

A method for measuring utilization to adjust water flow for cooling of servers and server components includes determining a utilization of a server. The server is water-cooled and includes one of a plurality of servers connected to a water supply manifold by one or more valves. Each server of the plurality of servers is water-cooled. The method also includes determining, based at least in part on the determined utilization of the server, a water flow rate to cool the server. The method includes adjusting, based at least in part on the determined water flow rate to cool the server, a water flow rate to the server via a valve controlling the water flow rate to the server.

An apparatus includes a water supply manifold connected to a plurality of servers. Each server of the plurality of servers is water-cooled. Each server is connected to the manifold by one or more valves. The apparatus includes a processor and non-transitory computer readable storage media storing code. The code is executable by the processor to perform operations including: determining a utilization of a server of the plurality of servers; determining, based at least in part on the determined utilization of the server, a water flow rate to cool the server; and adjusting, based at least in part on the determined water flow rate to cool the server, a water flow rate to the server via a valve of the water supply manifold controlling the water flow rate to the server.

A system includes a plurality of servers, and each server of the plurality of servers is water-cooled. The system includes a water supply manifold connected to the plurality of servers. The system includes a number of valves, and each valve of the number of valves controls a water flow rate to at least one server of the plurality of servers. The system includes a processor non-transitory computer readable storage media storing code. The code is executable by the processor to perform operations including: determining a utilization of a sever of the plurality of servers; determining, based at least in part on the determined utilization of the server, a water flow rate to cool the server; and actuating the valve controlling the water flow rate to the server to adjust, based at least in part on the determined water flow rate to cool the server, the water flow rate to the server.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
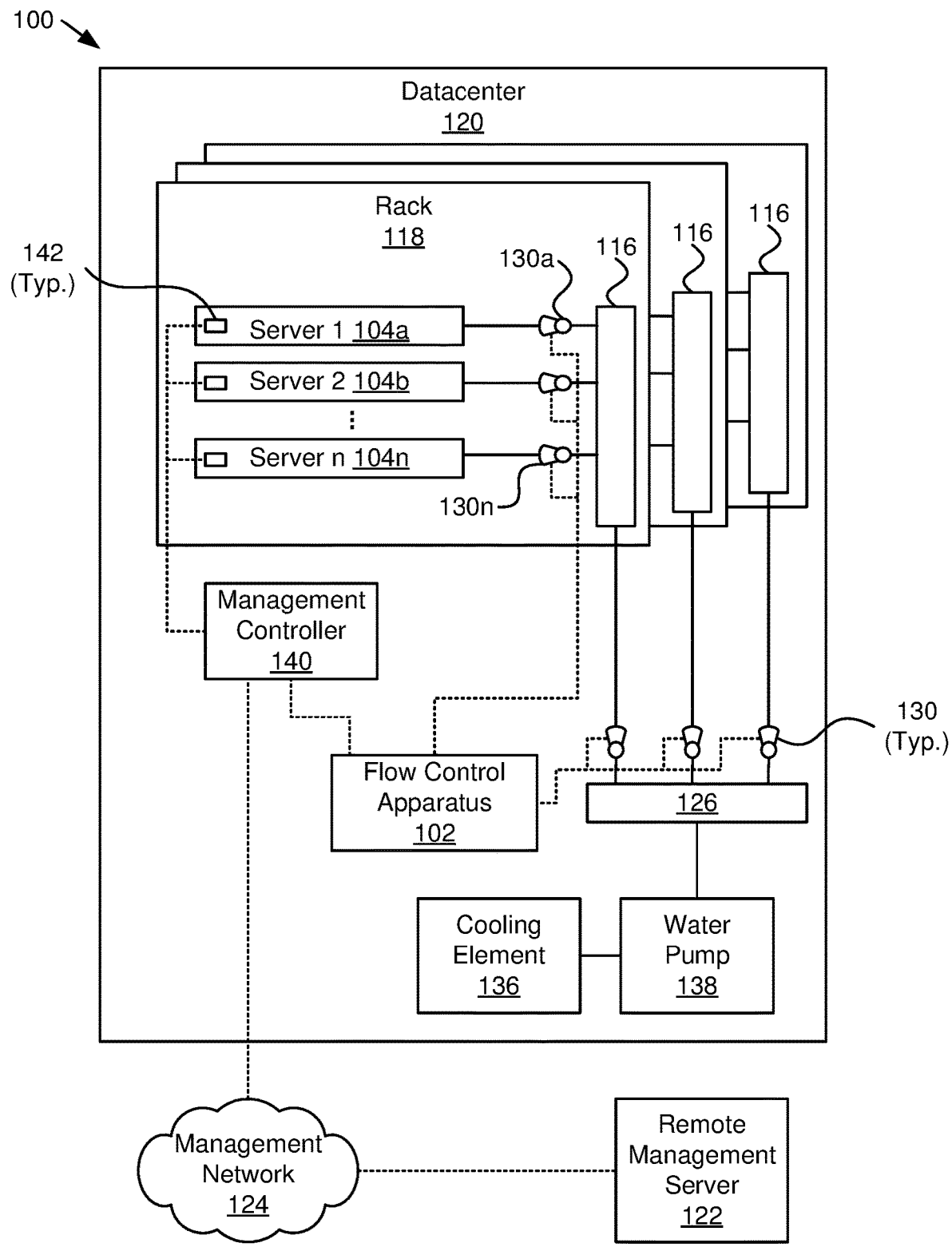
FIG. 1 is a schematic block diagram of a system for cooling servers, according to various embodiments.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices, in some embodiments, are tangible, non-transitory, and/or non-transmission.

Many of the functional units described in this specification have been labeled as modules, in order to more particularly emphasize their implementation independence. For example, a module may be implemented as a hardware circuit comprising custom very large scale integrated ("VLSI") circuits or gate arrays, off-the-shelf semiconductors such as logic chips, transistors, or other discrete components. A module may also be implemented in programmable hardware devices such as a field programmable gate array ("FPGA"), programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

More specific examples (a non-exhaustive list) of the storage device would include the following: an electrical connection having one or more wires, a portable computer diskette, a hard disk, a random access memory ("RAM"), a read-only memory ("ROM"), an erasable programmable read-only memory ("EPROM" or Flash memory), a portable compact disc read-only memory ("CD-ROM"), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages including an object oriented programming language such as Python, Ruby, R. Java, Java Script, Smalltalk, C++, C sharp, Lisp, Clojure, PHP, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. This code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

As used herein, a list with a conjunction of "and/or" includes any single item in the list or a combination of items in the list. For example, a list of A, B and/or C includes only A, only B, only C, a combination of A and B, a combination of B and C, a combination of A and C or a combination of A, B and C. As used herein, a list using the terminology "one or more of" includes any single item in the list or a combination of items in the list. For example, one or more of A, B and C includes only A, only B, only C, a combination of A and B, a combination of B and C, a combination of A and C or a combination of A, B and C. As used herein, a list using the terminology "one of" includes one and only one of any single item in the list. For example, "one of A, B and C" includes only A, only B or only C and excludes combinations of A, B and C.

A method for measuring utilization to adjust water flow for cooling of servers and server components includes determining a utilization of a server. The server is water-cooled and includes one of a plurality of servers connected to a water supply manifold by one or more valves. Each server of the plurality of servers is water-cooled. The method also includes determining, based at least in part on the determined utilization of the server, a water flow rate to cool the server. The method includes adjusting, based at least in part on the determined water flow rate to cool the server, a water flow rate to the server via a valve controlling the water flow rate to the server.

In some embodiments, the method includes predicting a future utilization of the server. In some embodiments, the method includes determining, based at least in part on the predicted future utilization, a predicted water flow rate to cool the server. In some embodiments, the method includes adjusting, based at least in part on the determined predicted water flow rate, the water flow rate to the server via the valve controlling the water flow rate to the server. In some embodiments, the water flow rate to the server is adjusted at a time of the predicted future utilization. In some embodiments, predicting the future utilization is based at least in part on the determined utilization, a future event affecting utilization, and/or a utilization-water flow model for the plurality of servers.

In some embodiments, the utilization-water flow model is derived through machine learning. The utilization-water flow model, in some embodiments, is based at least in part on data received from a number of the plurality of servers, the data including a temperature for each server of the number of the plurality of water-cooled servers, a utilization of each server of the number of the plurality of servers, and/or a water flow rate to each server of the number of the plurality of servers. The utilization-water flow model, in other embodiments, is further based at least in part on a correlation between the temperature of each server of the number of the plurality of servers and the utilization of each server of the number of the plurality of servers. The utilization-water flow model, in other embodiments, is further based at least in part on a correlation between the utilization of each server of the number of the plurality of servers and the water flow rate to each server of the number of the plurality of servers.

In some embodiments, determining the utilization of the server includes determining a utilization of a component of the server. In some embodiments, determining the water flow rate to cool the server further includes determining, based at least in part on the determined utilization of the component, a water flow rate to cool the component. In some embodiments, adjusting the water flow rate to the server further includes adjusting, based at least in part on the water flow rate to cool the component, a water flow rate to the component via a valve controlling the water flow rate to the component.

In some embodiments, the server and a number of the plurality of servers are positioned on a rack-mounted tray. In some embodiments, the water supply manifold includes one or more cooling lines to each server of the number of the plurality of servers. In some embodiments, each cooling line of the one or more cooling lines includes a valve of the one or more valves configured to adjust a water flow rate through the cooling line to a corresponding server.

Embodiments of the present disclosure include an apparatus for measuring utilization to adjust water flow for cooling of servers and server components. The apparatus includes a water supply manifold connected to a plurality of servers, where each server of the plurality of servers is water-cooled. Each server is connected to the water supply manifold by one or more valves. The apparatus includes a processor and non-transitory computer readable storage media storing code where the code is executable by the processor to perform operations. In some embodiments, the operations include: determining a utilization of a server of the plurality of servers; determining, based at least in part on the determined utilization of the server, a water flow rate to cool the server; and adjusting, based at least in part on the determined water flow rate to cool the server, a water flow rate to the server via a valve of the water supply manifold controlling the water flow rate to the server.

In some embodiments, the operations include predicting a future utilization of the server, determining, based at least in part on the predicted future utilization, a predicted water flow rate to cool the server, and adjusting, based at least in part on the determined predicted water flow rate, the water flow rate to the server via the valve controlling the water flow rate to the server. In some embodiments, the operations include adjusting the water flow rate to the server at a time of the predicted future utilization. In some embodiments, predicting the future utilization is based at least in part on the determined utilization, a future event affecting utilization, and/or a utilization-water flow model for the plurality of servers.

In some embodiments, the utilization-water flow model is derived through machine learning and is based at least in part on at least one of: data received from a number of the plurality of servers, where the data includes a temperature of each server of the number of the plurality of servers, a utilization of each server of the number of the plurality of servers, and/or a water flow rate to each server of the number of the plurality of servers; a correlation between the temperature of each server of the plurality of servers and the utilization of each server of the plurality of servers; and a correlation between the utilization of each server of the plurality of servers and the water flow rate to each server of the plurality of servers.

In some embodiments, determining the utilization of the server includes determining a utilization of a component of the server. In some embodiments, determining the water flow rate to cool the server includes determining, based at least in part on the determined utilization of the component, a water flow rate to cool the component. In some embodiments, adjusting the water flow rate to the server includes adjusting, based at least in part on the water flow rate to cool the component, a water flow rate to the component via a valve controlling the water flow rate to the component.

In some embodiments, the server and a number of the plurality of servers are positioned on a rack-mounted tray. In some embodiments, the water supply manifold includes one or more cooling lines to each server of the number of the plurality of servers, and each cooling line of the one or more cooling lines includes a valve of the one or more valves configured to adjust a water flow rate through the cooling line to a corresponding server.

Embodiments of the present disclosure include a system for measuring utilization to adjust water flow for cooling of servers and server components that includes a plurality of servers. In some embodiments, each server of the plurality of servers is water-cooled. The system includes: a water supply manifold connected to the plurality of servers; a number of valves, where each valve of the number of valves controls a water flow rate to at least one server of the plurality of servers; a processor; and non-transitory computer readable storage media storing code. The code is executable by the processor to perform operations including: determining a utilization of a server of the plurality of servers; determining, based at least in part on the determined utilization of the server, a water flow rate to cool the server; and actuating the valve controlling the water flow rate to the server to adjust, based at least in part on the determined water flow rate to cool the server, the water flow rate to the server.

In some embodiments, the operations include: predicting a future utilization of the server; determining, based at least in part on the predicted future utilization, a predicted water flow rate to cool the server; and adjusting, based at least in part on the determined predicted water flow rate, the water flow rate to the server via the valve controlling the water flow rate to the server. In some embodiments, predicting the future utilization is based at least in part on the determined utilization, a future event affecting utilization, and/or a utilization-water flow model for the plurality of sensors.

In some embodiments, the system includes an additional number of valves. In some embodiments, each valve of the additional number of valves controls a water flow rate to a component of at least one server of the plurality of servers. In some embodiments, the server and a number of the plurality of servers are positioned on a rack-mounted tray. In some embodiments, the water supply manifold includes one or more cooling lines to each server of the number of the plurality of servers. In some embodiments, each cooling line of the one or more cooling lines includes a valve of the number of valves configured to adjust a water flow rate through the cooling line to a corresponding server.

FIG. 1 is a schematic block diagram illustrating a system 100 for cooling servers 104a . . . 104n (which may be referred to individually or collectively as "104"), according to various embodiments. As illustrated in FIG. 1, a system 100 includes racks 118 of servers 104 within a data center 120, for example. The system also includes a main manifold 126 connected to a water supply 138. In some embodiments, the water from the supply 138 is cooled by the cooling element 136. The main manifold 126 includes valves 130 controlling water flow through cooling lines 112 to each rack 118. The main manifold 126 is connected to a number of rack supply manifolds 116. The system 100 includes a flow control apparatus 102 controlling water flow to the servers 104 through valves 130 of at least one rack supply manifold 116 and the main manifold 126.

In some embodiments, the data center 120 is a designated area, such as a building or a space within a building, for housing computing infrastructure and components, such as servers 104. The data center 120 is used for remote storage, processing, and/or distribution of data. In some embodiments, multiple different organizations and/or parties store data at the data center 120 remotely.

As data centers 120 accommodate processing-intensive applications, such as advanced analytics and AI, spatial constraints and workload demands increase. As a result, each rack 118 and server 104 can consume a high amount of energy and generates heat, creating a greater need for cooling systems to ensure safe and efficient operations. Liquid cooling meets these demands by effectively transferring heat from computing equipment.

Therefore, as illustrated in FIG. 1, servers 104 in the data center 120 are cooled through cooling lines 112 of liquid, such as cold water, to avoid overheating as utilization increases. The cooling lines 112 carry cooled liquid through the servers 104, wherein the liquid draws off the heat from the servers 104 and/or from underlying components of the servers 104. The system 100 adjusts flow rate to servers 104 of the data center 120 overall based on cooling needs of the various racks 118. Flow rate, utilization, power consumption, etc. information can be accessed, for example, through the remote management server 122. In some embodiments, based on the server utilization, flow rates throughout the system 100 are adjusted. For example, if the system 100 detects an overall increase in utilization, various valves 130 are adjusted to increase water flow to the servers 104. Flow rate is related to utilization since faster flows translate to faster heat transfer from the servers 104 to the liquid.

Not all racks 118 of servers 104, servers 104, or even components of servers 104 operate at the same level of utilization all of the time. Hence, not all servers 104 or components of servers require the same flow rates to prevent overheating. Therefore, cooling efficiency is improved and resources are conserved by dynamically adjusting water flow to individual racks 118, servers, 104, and/or components of servers 104 based on the utilization of those racks 118, servers 104, and/or components of servers 104, respectively. Additionally, utilization of a server 104 may not be constant, and optimally, cooling is adjusted as utilization changes.

Furthermore, since servers 104 generate different levels of heat based on their different utilization levels, adjusting water flow on a per-server 104 basis helps to ensure that heat is evenly distributed throughout the system 100. For example, servers 104 with higher utilization have higher cooling needs in order to remain at a certain temperature.

However, other servers 104 with lower utilization can stay at a given temperature with less water flow, so flow rates to those servers 104 can remain constant or can even be decreased while flow rates to higher-consumption servers 104 are increased.

For example, if utilization of a server 104a increases but the utilization of another server 104b remains constant, an increased rate of water flow will be needed to maintain the same level of cooling for the server 104a, but increasing the flow rate to server 104b would be unnecessarily and inefficient. Embodiments of the present disclosure include a flow control apparatus 102 increasing flow to the server 104a to be increased without disrupting flow to other servers 104b, . . . 104n. For example, the flow control apparatus 102 adjusts only the valve 130a controlling flow to that server 104a.

Adjusting water flow to the individual server 104a and/or to components of the individual server 104a in real time in response to changes in utilization helps to conserve overall energy of the system 100 and the capacity of water pumps 138 and cooling elements 136 in particular by eliminating unnecessary cooling of servers 104b . . . 104n. The flow control apparatus 102 is configured to: determine a utilization of a server 104, rack 118 of the servers 104, and/or component of a server 104 (GPU 310, CPU 306, memory 308, etc.); determine a flow rate of cooling liquid based on utilization; and adjust the flow rate accordingly. The flow control apparatus 102 is described in more detail with regard to the apparatuses 600 and 700 of FIGS. 6 and 7. While the system 100 is depicted as a datacenter 120, the flow control apparatus 102 is also applicable in any computing system with water-cooled equipment. One of skill in the art will recognize other environments where the flow control apparatus 102 may be used.

The flow control apparatus 102, in some embodiments, is in communication with a management controller 140. The management controller 140, in some embodiments, is in communication with each of the servers 104 and in communication with a management network 124. In some embodiments, the management controller 140 is in communication with a remote management server 122 via the management network 124.

The management controller 140, which may be called a baseboard management controller ("BMC"), provides access to computing devices of the datacenter 120. Although not shown in FIG. 1, this access is, in some embodiments, provided through a management server that also acts as a gateway for external communications. One example of a management controller 140 is a Lenovo® XClarity® Controller ("XCC"). The datacenter 120 includes one or more management servers in communication with the management controllers 140 located in the various computing devices of the datacenter 120.

Typically, the management controller 140 is connected to an internal and external management network 124 separate from a computer network used by virtual machines ("VMs"), containers, servers 104, etc. for communications, workloads, etc. The management controllers 140 typically have access to various components of the servers 104 and are able to control the components, report alerts and other data from the components and manage the components. In some embodiments, a management controller 140 is able to access components of the server 104 when the server 104 is not running and is often able to reboot the server 104.

The remote management server 122 includes a management portal that receives data from the management controller 140 and/or from one of the servers 104 over a secured connection, such as a VPN. The management portal, in some embodiments, interacts with hardware of the remote management server 122, such as a network interface card ("NIC") for receiving or importing data from the management server 104. In some embodiments, the management portal is running on a processor of the remote management server 118. In some embodiments, the remote management server 122 is a Lenovo® Xclarity® Administrator ("LXCA") or a Lenovo® Xclarity® Orchestrator ("LXCO"). In other embodiments, the remote management server 122 is from another vendor.

In some embodiments, the management network 124 includes a LAN, a WAN, a fiber network, a wireless connection, the Internet, and the like. In some embodiments, the management network 124 includes multiple networks, which may include private networks and/or public networks. The wireless connection may be a mobile telephone network. The wireless connection may also employ a Wi-Fi network based on any one of the Institute of Electrical and Electronics Engineers ("IEEE") 802.11 standards. Alternatively, the wireless connection may be a BLUETOOTH® connection. In addition, the wireless connection may employ a Radio Frequency Identification ("RFID") communication including RFID standards established by the International Organization for Standardization ("ISO"), the International Electrotechnical Commission ("IEC"), the American Society for Testing and Materials® ("ASTM"®), the DASH7™ Alliance, and EPCGlobal™.

Alternatively, the wireless connection may employ a ZigBee® connection based on the IEEE 802 standard. In one embodiment, the wireless connection employs a Z-Wave® connection as designed by Sigma Designs®. Alternatively, the wireless connection may employ an ANT® and/or ANT+® connection as defined by Dynastream® Innovations Inc. of Cochrane, Canada.

The wireless connection may be an infrared connection including connections conforming at least to the Infrared Physical Layer Specification ("IrPHY") as defined by the Infrared Data Association® ("IrDA"®). Alternatively, the wireless connection may be a cellular telephone network communication. All standards and/or connection types include the latest version and revision of the standard and/or connection type as of the filing date of this application.

FIG. 1 is meant to depict the functions and components of the system 100 and is not drawn to scale. Those of skill in the art will appreciate that different arrangements of the elements illustrated in FIG. 1 are within the scope of this disclosure.

Figure 6:
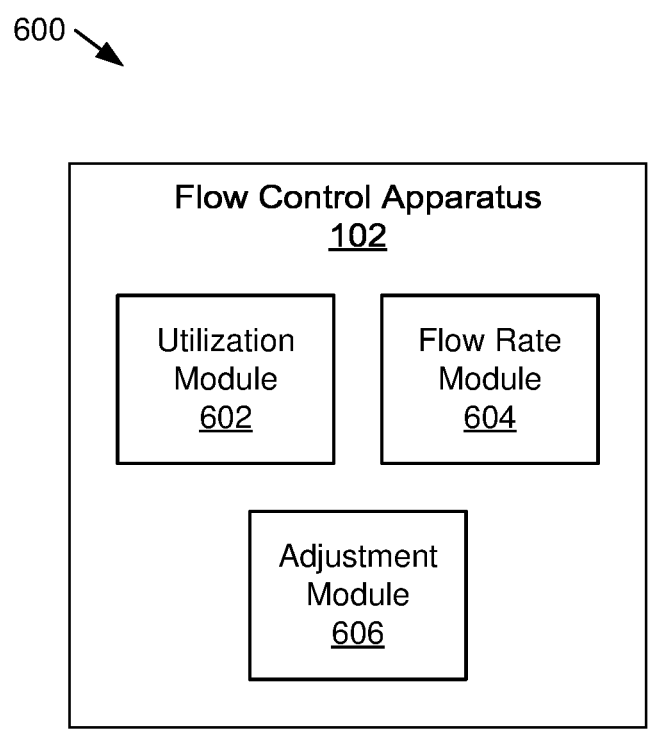
FIG. 6 is a schematic block diagram of a flow control apparatus, according to various embodiments.

FIG. 6 is a schematic diagram of an apparatus 600, according to various embodiments. The apparatus 600 is an embodiment of the flow control apparatus 102. In some embodiments, the flow control apparatus 600 includes a water supply manifold connected to a plurality of servers, such as rack supply manifold 116 connected to servers 104a . . . 104n. Each of the plurality of servers 104a . . . , 104n is water-cooled. Each server is connected to the water supply manifold by one or more valves 130. The apparatus 600 includes a utilization module 602, a flow rate module 604, and an adjustment module 606, which are described below. In some embodiments, all or a portion of the apparatus 600 is implemented with executable code stored on computer readable storage media. In other embodiments, at least a portion of the apparatus 600 is implemented using hardware circuits and/or a programmable hardware device.

The apparatus 600 includes a utilization module 602 configured to determine utilization of a server 104 of the plurality of servers 104a, . . . 104n. In some embodiments, the utilization module 602 is also configured to determine the utilization of the data center 120 as a whole, racks 118 of servers 104, and/or components of servers 104.

In some embodiments, utilization metrics and generated by an operating system and are transmitted from the servers 104 to the utilization module 602 or read by the utilization module 602. In other embodiments, utilization metrics are transmitted to the utilization module 602 from other elements of the system 100, such as the remote management server 122 in examples where the flow control apparatus 102 is in the remote management server 122. In some embodiments, the utilization module 602 is configured to determine utilization based on data from the operating system of the server 104. In some embodiments, determining the utilization of a server 104 via the utilization module 602 includes determining a utilization of a component (e.g., GPU 310, CPU 306, memory 308, etc.) of a server 104.

Figure 4:
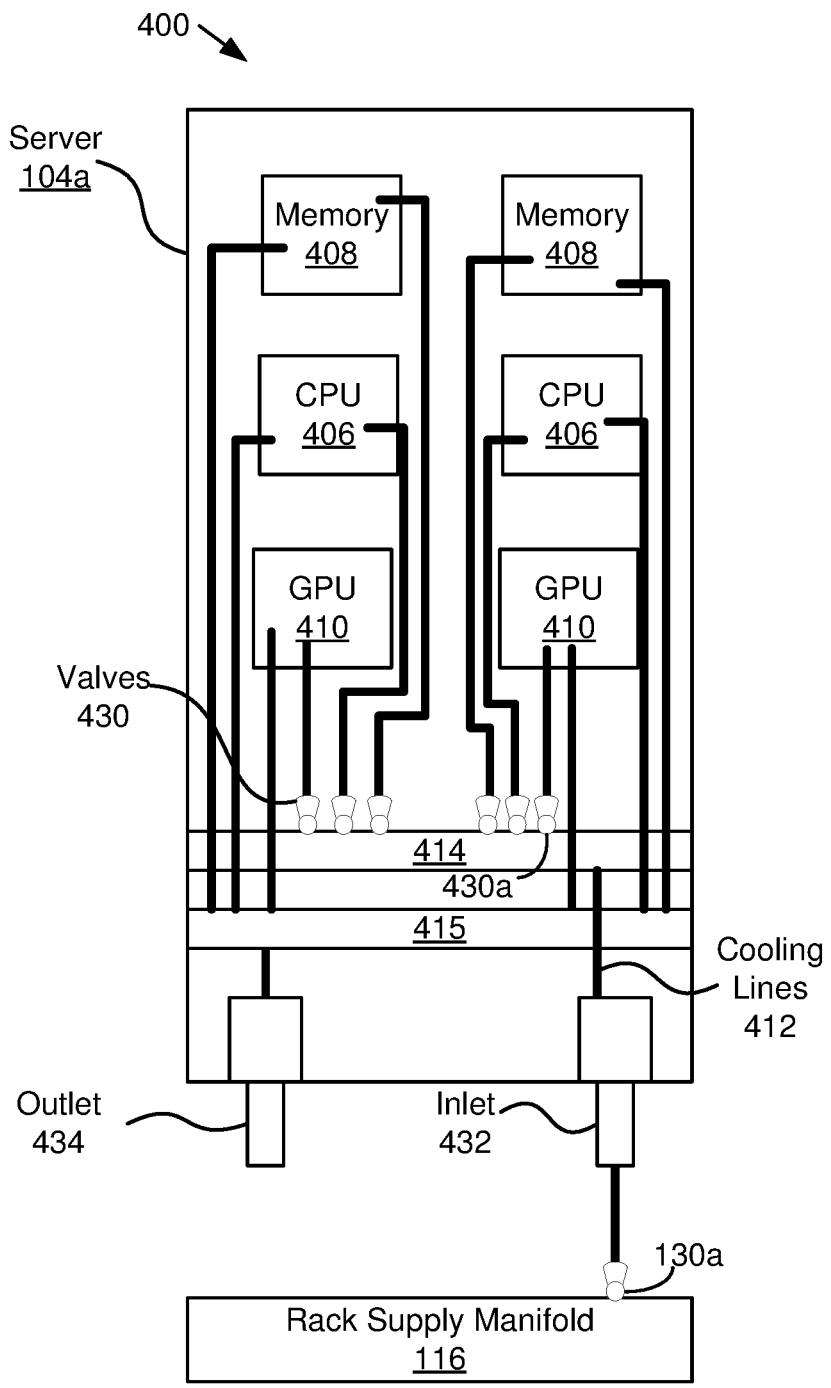
FIG. 4 is a schematic block diagram of a system for cooling components of servers, according to various embodiments.

In some examples, the utilization module 602 determines utilization by measuring the power consumption of a server 104a and/or component of the server 104a and calculating that power consumption as a percentage of the thermal design point ("TDP"), otherwise known as thermal design power, of a component of the server 104a (e.g., TDP of the CPU 406 of the server 104a in FIG. 4). The TDP is a pre-determined maximum amount of heat (or maximum amount of power) that can be generated by the CPU and dissipated through the cooling system 100. For example, the TDP of a CPU 406 of the server 104a is approximately 400 watts. In other words, an estimated maximum amount of power that can be generated by the CPU 406 and cooled by the system 100 is approximately 400 watts. In some examples, the GPU 410 also has a TDP.

Typically, power usage of a component of the server 104 is not correlated directly with utilization. The component is typically using power during an idle mode when utilization is zero and there is a relationship between minimum power to maximum power of the component and zero to 100 percent utilization. In some embodiments, utilization correlates approximately linearly between minimum and maximum power usage of a component. In other embodiments, utilization between minimum and maximum power usage varies according to a curve. Testing, analysis, etc. may be used to correlate utilization with power usage of a component.

In some examples, the utilization module 602 determines that a first server 104a with a TDP of 400 watts is operating at a utilization of about 95% capacity based on that TDP and current power consumption. The utilization module 602 determines that another server (e.g., server 104b of FIG. 2) is operating at a utilization of about 50% of capacity. The flow control apparatus 102 determines that a third server (e.g., server 104c of FIG. 2) is operating at a utilization of about 75% capacity. With this information, the flow rate module 604 may determine to increase water flow to the first server 104a by adjusting the valve 130a to the first server 104a, may decrease water flow to the second server 104b, and may keep water flow to the third server 104c constant. The adjustment module 606 then adjusts water flow to each of these servers by actuating valves 130 corresponding to the second and third servers 104b and 104c.

As used herein, the term "utilization" refers to a percentage and/or proportion representing an extent to which certain infrastructure is used when performing a workload. For example, a utilization of a rack 118 includes a percentage of the infrastructure of the rack 118 that is in use. A utilization of a server 104 includes a percentage of an infrastructure of that server 104 that is in use. In some embodiments, utilization can be defined as a capacity of execution in a component of the server, such as a GPU 310, CPU 306, memory 308, etc. A utilization of a component, such as a GPU 310, CPU 306, memory 308, etc. of a server 104 includes a percentage of the component that is in use. A utilization of the data center 120 includes a percentage of the infrastructure of the data center 120 that is in use. In some embodiments, utilization is instantaneous at a time of execution. In other embodiments, utilization is predictive and is determined before a workload, code, etc. is executed. For example, a predictive utilization is determined based at least in part on the jobs that are in the queue for a particular server 104. One of skill in the art will recognize other ways for the utilization module 602 to determine utilization.

The apparatus 600 includes a flow rate module 604 configured to determine a flow rate to cool the server. The flow rate, in some embodiments, is based at least in part on the utilization of the server, which is determined by the utilization module 602. As used herein, the term "flow rate" refers to a rate of flow of liquid through cooling lines 112 to a server 104, rack 118 of servers 104, component (e.g., GPU 310, CPU 306, and/or memory 308) of a server 104, or the like. In some embodiments, "flow rate" includes a rate of flow that will help to prevent overheating and/or maintain temperature below a certain degree. Although the term "water flow" is used herein, embodiments of the present disclosure are not so limited. Any suitable liquid may be used to cool elements of the system 100 through the cooling lines 112 controlled by a valve 130 or a similar device to control a rate of flow of flow of a liquid.

Since server utilization is correlated to power consumption, which directly translates into generated heat energy, the flow rate module 604, in some embodiments, identifies cooling needs by analyzing utilization of servers 104, and/or components of servers 104 determined by the utilization module 602. The flow rate module 604 is configured to determine a flow rate for cooling based on the utilization determined by the utilization module 602, which may improve flow rates which may then translate into a faster and/or more efficient heat exchange between the servers 104 and the cooling lines 112.

Additionally, the flow rate module 604 is configured to determine a correlation between utilization and water flow rates. In some embodiments, the apparatus 600 is configured to gather data from servers 104a, . . . , 104n over time and correlate utilization of the servers 104a-n with the flow rates of the servers 104a-n. As described in connection with the utilization-water flow model module 752 of FIG. 7, correlation between utilization and flow rates is done, for example, through machine learning. Thus, when a new server is added to the system 100, the flow rate module 604 is configured to determine a flow rate for that server based on a model of utilization and flow rates of other servers 104 of the system 100.

In some embodiments, the flow rate module 604 is configured to determine a flow rate based on utilization along with data transmitted from various sensors within the system 100. For example, the flow rate module 604 determines a flow rate of a server 104a based on a temperature reading of that server 104a from a sensor along with utilization of that server 104a. For example, the server 104a and/or a sensor configured to measure the temperature of the server 104a transmits a high temperature reading to the apparatus 600. In response, the flow rate module 604 uses utilization and temperature to determine updated flow rates to that server 104a to achieve desired temperatures throughout the system 100. For example, where temperature readings are hotter, flow rate may be increased above what would be determined to be appropriate based on utilization of a server 104 to achieve a same amount of cooling as when temperatures readings are cooler. The flow rate module 604 may use other parameters, such as humidity, along with utilization to determine flow rate of a server 104.

In some embodiments, historical data relating to utilization and associated power consumption is stored on and accessed via the remote management server 122. The flow rate module 604 uses this information to determine flow rates. Together with adjustments made through the adjustment module 606, this historical data may improve cooling by dynamically adjusting water flows based on different factors, such as articulations of the environment of the system 100 and different workloads of servers 104. For example, as workloads of the servers 104 change to increase utilization, the utilization module 602 determines the new utilization and the flow rate module 604 determines updated flow rates in response to changes in utilization of that server 104. Thus, the flow rates can be dynamically adjusted, for example, by the adjustment module 604. In other examples, ambient air temperature of some parts of the data center 120 increases, causing increased temperatures of the servers 104. In such cases, the flow rate module 604 determines updated flow rates in real time in response to changes in temperature of that server 104 along with changes in utilization of the server 104.

In some embodiments, the flow rate module 604 is configured to determine the water flow rate based on the operational status of a server 104. In some examples, the server 104 is in an "idle" operational state. This operational state is communicated to at least one of the apparatus 600, management controller 140, and/or remote management server 122. The server 104 requires little to no water flow in an "idle" state, so the flow rate module 604 determines a low flow rate for that server 104.

In some embodiments, the flow rate module 604 is configured to determine a flow rate based on temperature of a supplied liquid (for example, water from rack supply manifold 116 in FIG. 1 and/or the main manifold 126 in FIG. 1). Determining a water flow rate, in some embodiments, includes determining a flow rate that is proportional to the inlet water temperature, since lower water temperatures can achieve similar cooling effects with lower flow rates than higher water temperatures. Water temperature is determined, in various examples, via at least one of: information from the remote management server 122, inputs, measurements from temperature sensors, or the like, or any combination thereof.

In some embodiments, the flow rate module 604 is configured to determine a water flow rate to a server 104a to minimize condensation risk. Running cooling lines 112 within the data center 120 and within the servers 104 (as shown, for example, in FIG. 3) creates a condensation risk within the server. Condensation risk is minimized by keeping the temperature of the servers 104 above room dew point. For example, the apparatus 600 and/or remote management server 122 determines a room dew point of the data center 120 based on inputs and/or calculations. The room dew point is determined, for example, based at least in part on: input by a user, calculations based at least in part on the relative humidity of the data center, measurements from a hygrometer, or any combination thereof. For example, a data center 120 with ambient air having a relative humidity of 52% has a room dew point of approximately 21° C. The flow rate module 604 is configured to determine a flow rate that will maintain a temperature of the server 104a above the room dew point of approximately 21° C.

In some embodiments, the flow rate module 604 is also configured to determine a current water flow rate to a server 104, rack 118, and/or component of the server 104. The current water flow rate determination is based on, for example, at least one of the following: input from a technician and/or a remote management server 122, measurements from one or more sensors, stored data regarding previous water flow rate adjustments, or any combination thereof. In some embodiments, leaks and/or pressure losses in the system 100 are determined based at least in part on the current water flow rate. For example, the flow rate module 604 is configured to determine an actual water flow rate to a server 104 based at least in part on measurements from a sensor.

The flow rate module 604 is further configured to determine that the water flow rate to the server 104 is lower than would be expected based at least in part on a previous adjustment to a valve 130 corresponding to the server 104. The flow rate module 604 is further configured to determine that this inconsistency indicates a leak in the system 100 or another type of pressure loss. Appropriate action is taken based on a such a determination. For example, in some embodiments, the appropriate action includes transmitting a notification of a leak to a remote management server 122 and/or a device of a technician of the data center 120. The notification of the leak includes an approximate location within the data center 120 of the leak and/or a location of a piece of equipment (e.g., server 104a in position u1) associated with the leak.

The apparatus 600 includes an adjustment module 606 configured to adjust the water flow rate to a server 104 based at least in part on the water flow rate to cool the server determined by the flow rate module 604. In some embodiments, this adjustment is made via a valve 130 of a manifold, such as a rack supply manifold 116, that controls the water flow rate to a server 104. In some examples, the adjustment module 606 includes instructions executable by a processor to actuate opening and/or closing of a valve 130 to increase or decrease water flow rates, respectively.

In some embodiments, the adjustment module 606 is in communication with the valves 130 of the main manifold 126 and/or the rack manifold 116. As such, the adjustment module 606 is configured to actuate a valve 130 of the main manifold 126 to adjust water flow to a rack 118. The adjustment module 606 also adjusts a valve 130 of the rack manifold 116 to adjust water flow to an individual server 104 of the rack 118. Although not shown in FIG. 6, in some embodiments, the apparatus 600 also includes a water supply manifold (e.g., manifold 126 of FIG. 1) connected to a plurality of servers 104.

Figure 3:
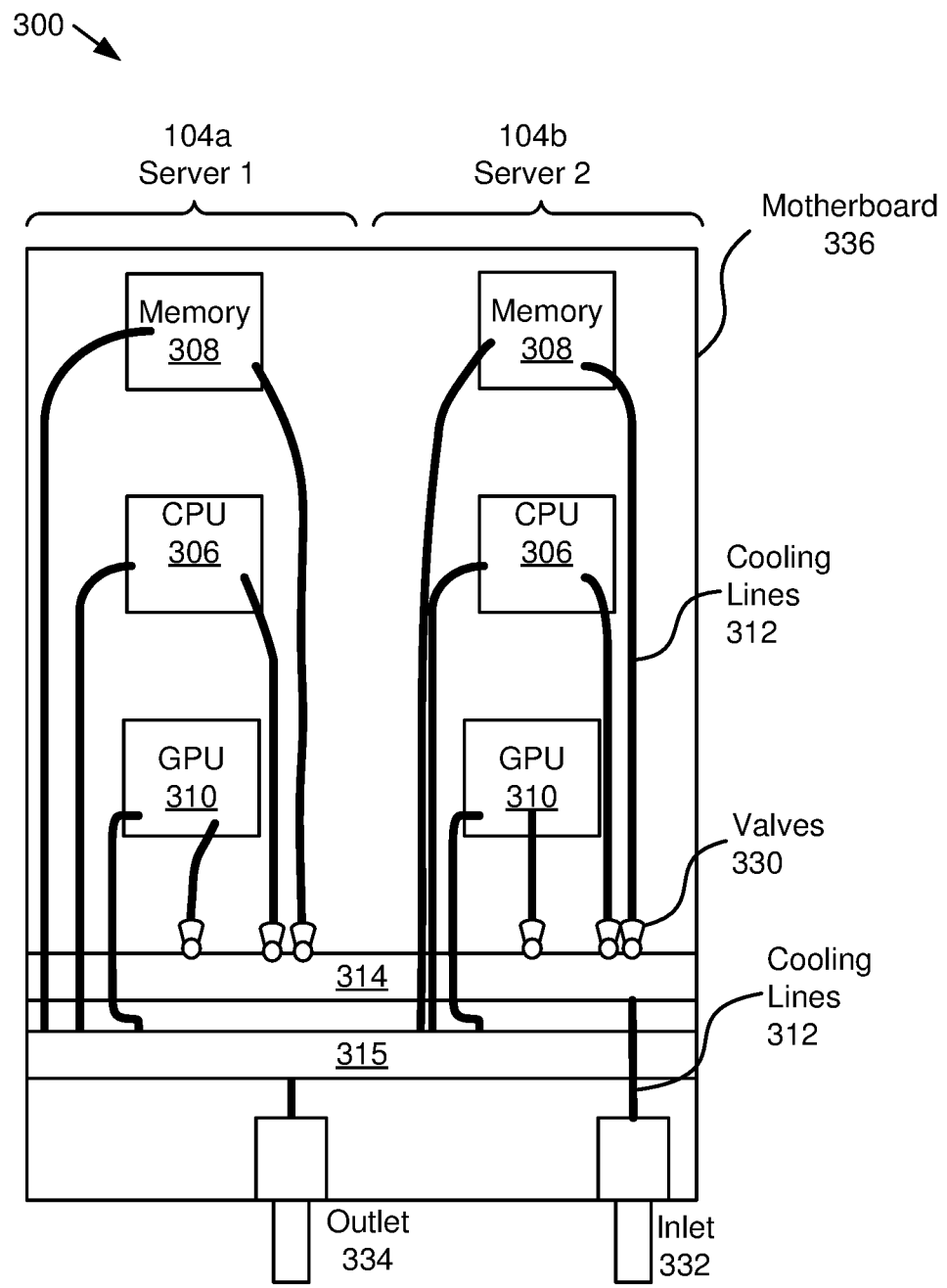
FIG. 3 is a schematic block diagram of a system for cooling components of servers, according to various embodiments.
Figure 5:
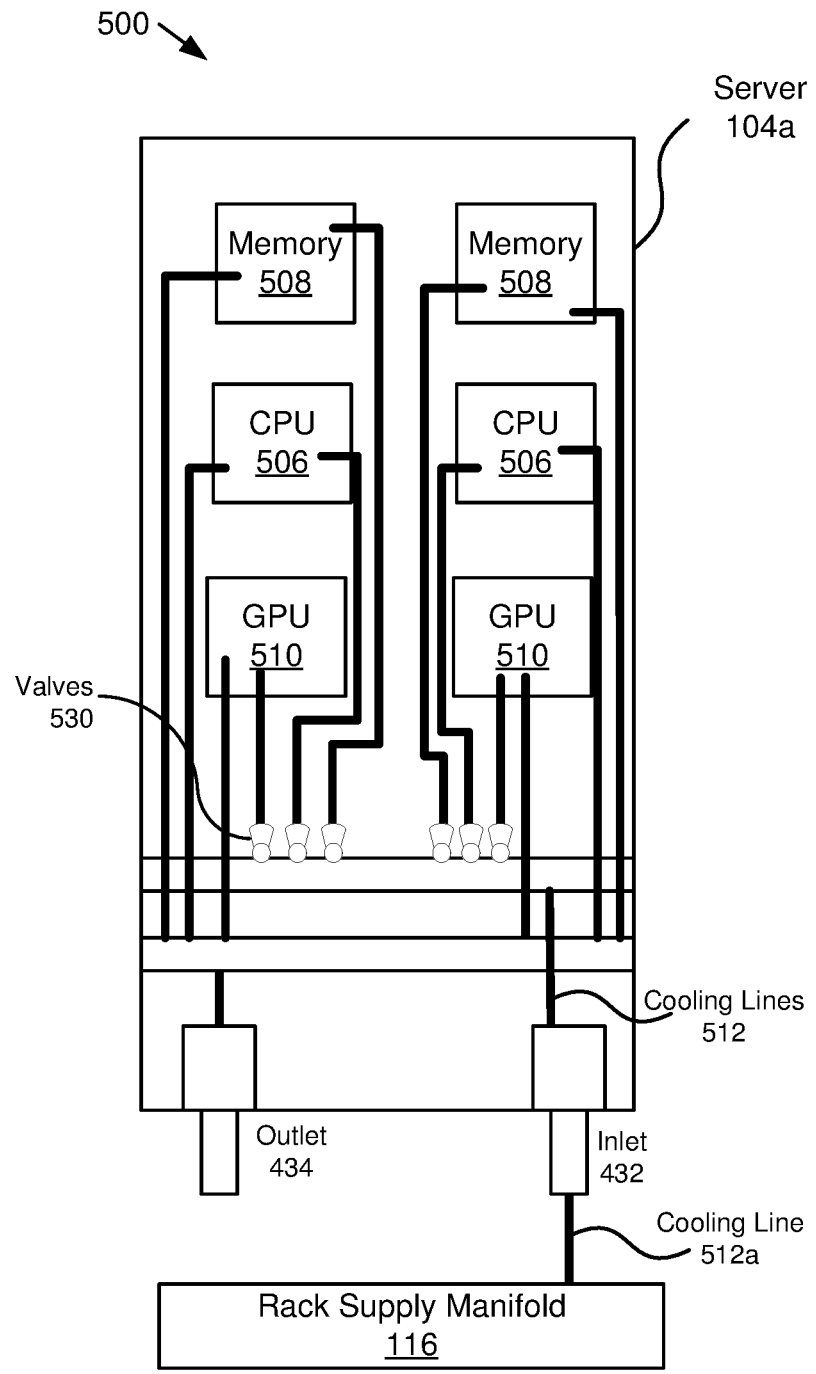
FIG. 5 is a schematic block diagram of a system for cooling components of servers, according to various embodiments.

As shown in FIGS. 3-5, in some embodiments, the adjustment module 606 is configured to adjust the water flow rate to the server 104 by adjusting, based at least in part on the water flow rate to cool the component determined by the flow rate module 604, a water flow rate to a component of the server 104 via a valve (e.g., valves 330 of FIG. 3) controlling the water flow rate to a component of the server.

Although an adjustment module 606 that actuates adjusting the valves 130 to control water flow is described herein, embodiments of the present disclosure are not so limited. For example, in some embodiments, the flow rate module 604 determines a flow rate to a server and/or component of the server and communicates the appropriate flow rate and/or corresponding adjustment to another element of the system 100. In other embodiments, the adjustment module 606 includes an actuator connected to a valve 130 where the actuator adjusts water flow rate of a valve 130 based on a flow rate from the flow rate module 604. In other embodiments, the adjustment module 606 includes the valve 130 to be adjusted.

While the apparatus 600 is depicted as apparatus 102 in the data center 120 in FIG. 1, some or all of the apparatus 600 may be located elsewhere, such as in a rack 118 of the data center, in the management controller 140, in the remote management server 122, or the like. In some embodiments, the apparatus 600 is implemented as code stored on a computer readable storage device, which is non-transitory. The computer readable storage device may include volatile memory or non-volatile memory. For example, the code may be stored on one or more computer readable storage devices in the form of hard disk drives, solid state storage, etc. and portions may be loaded into RAM for execution on a processor. In other embodiment, the apparatus 600 is implemented using other devices, such as a programmable hardware device. One of skill in the art will recognize other ways of implementing the apparatus 600 in a computing system 100 or computing device.

Figure 7:
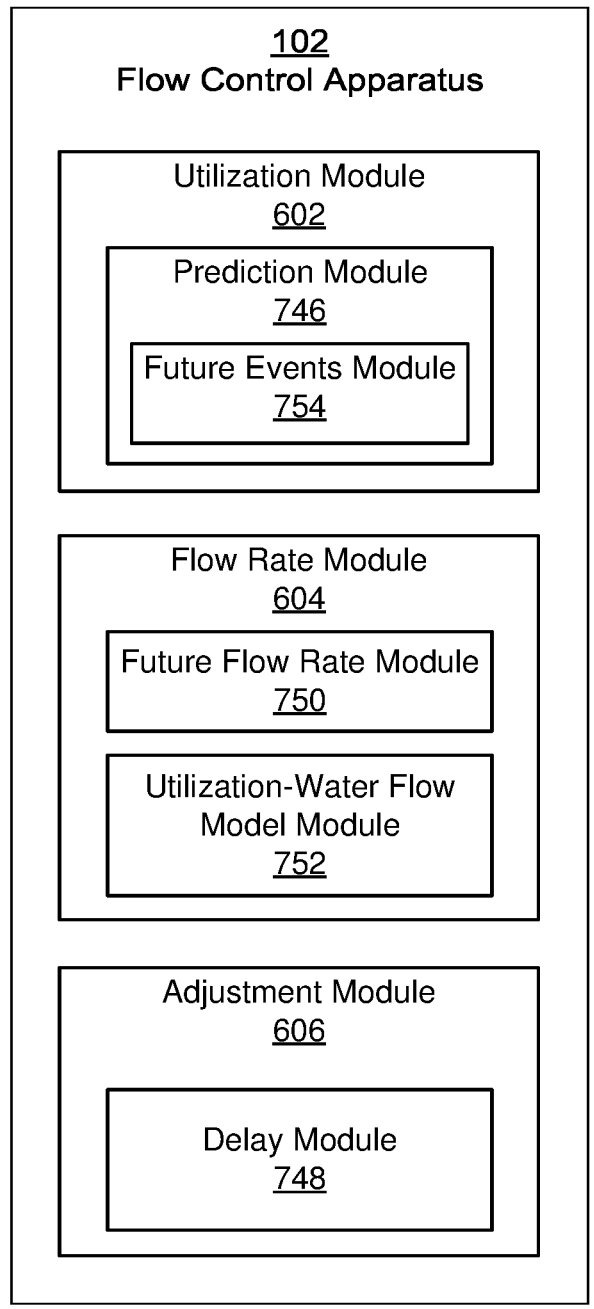
FIG. 7 is a schematic block diagram of a flow control apparatus, according to various embodiments.

FIG. 7 is a schematic block diagram of a flow control apparatus 700, according to various embodiments. The apparatus 700 is an embodiment of the flow control apparatus 102. The apparatus 700 includes a utilization module 602, a flow rate module 604, and an adjustment module 606, which are substantially similar to those described above with regards the apparatus 600 of FIG. 6. In various embodiments, the apparatus 700 includes a prediction module 746, a future events module 754, a future flow rate module 750, a utilization-water flow model module 752, and/or a delay module 748, which are described below. In some embodiments, the apparatus 700 is implemented in a similar way as the apparatus 600 of FIG. 6.

In some embodiments, the utilization module 602 includes a prediction module 746 configured to predict a future utilization. In some embodiments, the future utilization includes a future utilization of the server 104, individual components of the server 104, a rack 118 of servers 104, and/or of the entire datacenter 120. The prediction module 746 is configured to predict future utilization, at least in some examples, based at least in part on a current utilization determined by the utilization module 602, of a future event affecting utilization (e.g., an event determined by the future events module 754), and/or a utilization-water flow model (e.g., a model stored in the utilization-water flow model module 752). The prediction module 746, in some embodiments, is further configured to predict the future utilization based on any of the following: an upcoming workflow, past utilization of the server, historical data of utilization of other servers, or any combination thereof. The prediction module 746, in some embodiments, is configured to predict this future utilization based at least in part on machine learning, models, and/or future events.

In some embodiments, the prediction module 746 is configured to predict future utilization based on a queue of upcoming workflows. A queue of upcoming workflows includes, in some examples, a dynamically updated list of workflows which the server 104 plans to execute within an upcoming timeframe of a few minutes, a few seconds, or less. In some embodiments, the prediction module 746 is configured to predict an associated utilization for each workflow. In some embodiments, the prediction module 746 predicts a utilization for each workflow based at least in part on at least one of the following: information about the workflow received from the server, past utilization of the server 104 while running the workflow and/or similar workflows, past utilization of servers similar to the server 104 while running the workflow and/or similar workflows, or any combination thereof. The prediction module 746 predicts that the utilization of a server 104 will change to a predicted utilization at or around a time that the prediction module 746 determines based on a particular workflow's priority in the queue.

In some examples, the prediction module 746 is configured to predict future utilization of a server 104 and/or server 104 components based on a workload scheduler of the server 104. For example, the workload scheduler includes, in some examples, a dynamically updated list of workflows which the server 104 plans to execute in the future. In some examples, the workload scheduler includes a list of workflows that the server 104 plans to execute within the next few minutes or hours. In some examples, the workload scheduler includes a list of workflows that the server 104 plans to execute at certain times during a day. In some embodiments, the workload scheduler has the workflows scheduled on a reoccurring basis. The prediction module 746 predicts that the utilization of a server 104 will change to a predicted utilization at or around a time that the workload scheduler has scheduled the server 104 to execute the workflow.

The apparatus 700 is configured to monitor certain parameters as a function of the time of day, day of the week, and/or time of the year. For example, the utilization module 602 monitors utilization. Thus, the prediction module 746 is configured, in some embodiments, to predict utilization of a particular server 104a based on past utilization at a particular time of day, day of the week, and/or time of the year. Thus, the prediction module 746 is configured to predict utilization based on daily, weekly, monthly, and/or seasonal trends for utilization observed for either the server 104 and/or other servers are also, in some embodiments, factored into the prediction.

For example, the prediction module 746 determines that utilization increases during months associated with higher retail activity. In such examples, the prediction module 746 predicts an increased utilization in the months of November and December, since those months include events such as Black Friday, Christmas or other holidays that create higher demand for online ordering.

In some embodiments, when new equipment (e.g., a server) is introduced to the system 100 and/or to the data center 102, the prediction module 746 is configured to predict a utilization of that equipment based on historical data for other equipment. For example, a new server 104n is introduced to the system 100. The prediction module 746 predicts a utilization of the server 104n and/or predicts a water flow rate 904 of the server 104n based on data from other servers 104a, . . . 104n-1. In some embodiments, prediction of utilization is done at the component level. In some examples, the prediction module 746 analyzes utilization and/or water flow data from CPUs 306 of servers 104a . . . 104n-1 to predict a utilization and/or water flow rate to a CPU of a new server 104n. In other examples, the CPU of a server 104n is replaced, and the prediction module 746 analyzes utilization and/or water flow data from a previous CPU of the server 104n and/or from CPUs 306 of other servers 104a, . . . 104n-1 to predict a utilization and/or water flow rate.

In some embodiments, the prediction module 746 includes a future events module 754 configured to determine future events that could affect utilization of servers 104. In some examples, the future events module 754 stores and processes information relating to future calendar events. In some examples, the future events module 754 predicts increased utilization due increased demands on servers 104 during events such as Black Friday. In some embodiments, the future events module 746 includes future workflows that the server 104 will run. In some examples, the future events module 746 is configured to factor a workflow in the queue of the server 104 and/or a workflow that is typically run at a certain time of day into the predicted utilization of the prediction module 746.

In some embodiments, the flow rate module 604 includes a future flow rate module 750 and a utilization-water flow model module 752. The future flow rate module 750 is configured to determine, based at least in part on the predicted utilization of the prediction module 746, a predicted water flow rate to cool a server 104.

The future flow rate module 750, in some embodiments, is configured to analyze past data, including correlations between utilization and water flow for the server 104 and/or for other servers. In some embodiments, past data shows that a given water flow rate to a server 104 was sufficient to prevent the server 104 from overheating while working at a given utilization. In some examples, calculation of a correlation also includes a temperature of the water supply. In some examples, the data being analyzed shows that inlet water temperature at 8° C. flowing to a server 140a at a rate of 8.5 gallons per minute ("gpm") is sufficient to prevent the server 104a from overheating while operating at a utilization of 60%. The future flow rate module 750 determines an ideal flow rate for another server or the same server operating at 60% utilization is based on this data.

In some embodiments, the flow rate module 604 stores and analyzes data periodically to update and/or predict water flow rates. For example, the flow rate module 604 stores and analyzes data on a monthly basis to update predictions for the upcoming month. Making predictions for an upcoming month includes, for example, analyzing data from the previous month (e.g., analyzing data from June to predict flow rates for July) and/or analyzing data from that month in previous years (e.g., analyzing data from previous Julys).

In some embodiments, the future flow rate module 750 analyzes data relating to past workflows of the server 104a and determines an ideal water flow rate based on a comparison to the workflows scheduled to run in a coming month. For example, the future flow rate modules 750 determines that server 104a ran Workflow 1 and Workflow 2, which are both computationally expensive, in the previous month. The future flow rate module 750 increases a water flow rate prediction based on determining that the server 104a is also scheduled to run Workflow 1 and/or Workflow 2 in the coming month.

In some embodiments, the future flow rate module 750 is configured to predict increases in temperature of the servers 104 and predict increases in flow rates based at least in part on those temperature increases. For example, in some embodiments, an increased temperature of servers 104 is observed during times of the year in which the outdoor temperature (e.g., temperature outside of the data center 120) is high. In such embodiments, the future flow rate module 750 is configured to predict increased water flow during July and August, which may be the hottest months for the outdoor climate of the data center 120.

In some embodiments, the future flow rate module 750 also determines future flow rates based on a utilization-water flow model. For example, a system 100 gathers data from various servers (e.g., 104b, . . . 104n). This data includes, for example: the utilization and water flow rates of each server 104; utilization and/or water flow rates of racks 118 of servers 104; utilization and/or water flow rates of component of servers; or any combination thereof. It can also include other data, such as temperature of the servers 104. From this data, correlations between temperature and utilization and/or utilization and water flow rates are established. Using machine learning, for example, a model is constructed to predict utilization of a server 104a.

The utilization-water flow model module 752 includes a utilization-water flow model. The utilization-water flow model, in some embodiments, is based at least in part on data received from a number of the plurality of water-cooled servers 104a, 104n. In some embodiments, the data includes a utilization of each server 104, and/or a flow rate to each server 104. In some embodiments, the utilization-water flow rate model based at least in part on a correlation between the temperature of each server 104 and the utilization of each server. In some embodiments, the utilization-water flow model is based at least in part on a correlation between the utilization of each server and the water flow rate to each server.

In some embodiments, the utilization-water flow module 752 is configured to measure temperature of the servers 104 along with flow rates and utilization to determine what flow rates keep temperatures below a certain limit at various utilization rates. This allows the utilization-water flow model module 752 to model temperature as a function of flow rates and/or utilization using machine learning. In some embodiments, the utilization-water flow model module 752 is configured to construct a model using deep learning techniques.

In some embodiments, the utilization-water flow model module 752 collects data from the servers 104 during a training phase. With this data, the utilization-water flow module 752, in some embodiments, is able to construct a model to determine what flow rate is required to maintain a server 104 at a certain temperature and/or utilization level. In some embodiments, this is considered an "ideal water flow rate." When a new server 104n is introduced to the system 100, the utilization-water flow model module 752 estimates an ideal water flow rate based on ideal water flow rates of similar servers within the system 100.

In some embodiments, the utilization-water flow model module 752 comprises a neural network for constructing and updating the utilization-water flow model using deep learning techniques. For example, inputs of the neural network can include data such as utilization of servers 104 and/or server components. The utilization-water flow model module 752 correlates utilization with flow rates. Once the initial model is constructed, utilization of a server 104 and/or components of the server 104 can be input to determine an estimated ideal flow rate. In some embodiments, inputs for the neural network also include temperature of the server 104 and/or server components 104. In such embodiments, the utilization-water flow model module 752 is configured to determine what flow rate(s) will maintain the server 104 and/or component of the server 104 within a certain temperature range during a period of a particular utilization range.

In some embodiments, the utilization-water flow model module 752 is configured to continuously receive data after the training phase has ended and update the model based on the new data. Analyzing data relating to utilization and water flow after the training phase can help provide adjustments necessitated by, for example, at least one of the following: new workflows being run on the servers 104, new servers 104 being introduced to the system, and/or different times of year associated with different rates of utilization.

In some examples, the utilization-water flow module 752 collects data from multiple servers 104. These servers 104 include, for example, all of the servers 104 in the data center 104. However, in some embodiments, the model also includes data from servers in other data centers. For example, the model includes data from servers that are similar to at least one server 104a in the data center 120 but that are housed in other data centers. In some embodiments, data from servers of other data centers is used in training phase to find correlations between utilization and water flow and construct the initial module. In some examples, the utilization-water flow model module updates the model as it receives more data from the data center 120. Data may include, but is not limited to, server temperature, server utilization, and/or optimal flow rates corresponding to utilization. The data includes similar parameters for components of servers and/or for racks of servers.

In some embodiments, the flow rate module 752 uses the model of the utilization-water flow model module 752 to determine a flow rate for a server 104a based on data from servers with similar properties. In other embodiments, the flow rate module 752 uses the model to determine a flow rate for a CPU (e.g., CPU 306) of a server 104 based on data from CPUs of servers with similar properties. In some embodiments, as discussed above, the utilization-water flow model is derived through machine learning. The model is based on factors such as, but not limited to, data received from a subset or the entire plurality of water-cooled servers 104, a correlation between a temperature of each server 104 and a utilization of each server, and/or a correlation between a utilization of each server 104 and the water flow rate to each server 104. For example, the utilization-water flow model module 752 may determine that, based on the model derived through machine learning, a server 104 operating at a particular utilization has a temperature that is or soon will be above an ideal temperature range. The utilization-water flow model module 752 determining this is based on, for example, past observations of servers 104 operating at that utilization level. The utilization-water flow module 752 determines that a particular flow rate is sufficient to maintain the temperature of the server 104 within the ideal range, even at a high utilization. The utilization-water flow module 752 makes this determination based on the model.

The data includes, for example, temperature for each server 104, a utilization of each server 104, and/or a water flow rate to each server 104. In some embodiments, this data is gathered and communicated to the apparatus 700 via one or more sensors. For example, a temperature sensor in each server 104 provides temperature readings to the apparatus 102 in some embodiments. In some embodiments, this data is transmitted from the servers 104 themselves to the flow control apparatus 102.

In some embodiments, the utilization-water flow model module 752 models utilization as a function of what workflows are being run on the servers 104. Using this information, the flow rate module 604 determines an ideal flow rate of water to the server 104 and/or a component of that server based on the current work flows that are being run and/or on the work flows in the queue of the server 104. Using machine learning allows the utilization-water flow model module 752 to analyze larger sets of data and therefore construct a more comprehensive and accurate model for utilization based on the workflows. For example, during a training phase, the utilization-water flow model module 752 uses utilization data from servers 104a, . . . 104n and/or servers outside of the data center 120 to find correlations between certain workflows and utilization. Once the model is constructed, the utilization-water flow model module continues to update the model based on observations from the data center 120 regarding utilization as a function of workflows. In some embodiments involving neural networks, the workflow type constitutes an input that helps the utilization-water flow model module to determine water flow rates, either directly or indirectly through predicted utilization.

In some embodiments, the model is constructed by the utilization-water flow model module 752 within the flow rate module 604 based on data received from servers, datacenters, racks, and/or components of servers. However, in other embodiments, the model is used by the utilization-water flow model module 752 but constructed by another component of the system 100 with which the flow control apparatus 702 is in communication. For example, in some embodiments, the model is constructed by a remote management server 122 but used by the flow control apparatus 700 to predict utilization and/or determine optimal water flow rates.

Like the flow control apparatus 600, the flow control apparatus 700 includes an adjustment module 606. The adjustment module 606 is configured to adjust, based at least in part on the determined predicted water flow rate, the water flow rate to the server 104a via the valve 130a controlling the water flow rate to the server 104a. The adjustment module 606, in some embodiments, is further configured to adjust the water flow to the server 104 at a time that the prediction module 746 predicts a change in utilization of the server 104a and/or at a time that the future flow rate module 750 predicts that a change in flow rate to the server 104 would be optimal. For example, if the future flow rate module 750 determines that a change in the water flow rate to the server would be optimal at 10:00:00 a.m. on a particular day, the adjustment module 606 contains instructions executable to adjust a component controlling water flow to that server (e.g., a valve 130) at such a time as to achieve the desired change in flow at the desired time.

In some embodiments, the adjustment module 606 is configured to automate the valves 130 and schedule them to adjust water flow to particular racks 118, servers 104 and/or components of the servers 104 at certain times of day, days of the week or month, and/or times of the year. For example, the utilization module 602 determines that certain workflows require a certain level of utilization. The prediction module 746 determines that these workflows are run on certain servers 104 at particular times of the day, days of the week, and/or times of the year. For example, the remote management server 122 determines a schedule for workflows based on communication with the management controller 140 or with individual servers 104. In other embodiments, the adjustment module 606 determines this schedule.

The adjustment module 606, in some embodiments, schedules the valves 130 to adjust at certain times of day, days, and/or times of year based on what workflows the individual servers 104 are running at those times. In some examples, the flow control apparatus 102 determines that a subset 104a and 104c of the servers 104a, . . . 104n run a high-demand workflow from 8:00:00 to 17:00:00, Monday-Friday. The adjustment module 606, in some embodiments, creates a schedule and predictively adjusts valves 130 controlling water flow to servers 104a and 104c at 8:00:00 Monday-Friday. The schedule, in some embodiments, also involves predictively adjusting the valves 130 for decreased utilization after 17:00:00 Monday-Friday and on weekends.

In some embodiments, the adjustment module 606 includes a delay module 748. For example, there is often a time delay between adjusting a component controlling water flow (e.g., a valve 130) and achieving a change in the water flow rate and/or a achieving a change in the temperature of water-cooled equipment. At least for this reason, in some embodiments, determining adjustment to a flow rate includes determining when to make that adjustment. In some embodiments, the prediction module 746 determines that the utilization of the server 104a is going to increase at a time $t_1$, but the delay module 748 determines that there will be a delay period between adjusting a valve 130 and achieving a change in water flow at the server 104a. The delay module determines 748 that the valve 130 should be adjusted at a time to that is prior to $t_1$.

For example, there is a delay of approximately 10 seconds between adjusting a valve 130a to a server 104a and achieving the desired change in the rate of water flow to that server 104. The delay module 748 is configured to determine that delay and/or to receive that delay as an input from another component of the system 100. In some embodiments, the delay module 748 is configured to adjust a valve 130 some delay period prior to when a change in water flow rate is needed. For example, if the flow rate module 604 predicts that a change in flow rate will be needed at approximately 10:00:00 a.m. due to a predicted or measured change in utilization of server 104a as determined by the utilization module 602, the delay module 748 may include instructions to actuate adjusting valve 130a at approximately 9:58:00 a.m. to ensure that a change in flow rate has been achieved by 10:00:00 a.m.

In some embodiments, prediction module 746 determines that the utilization of the server 104a will increase at a future time. The delay module 748 determines the timing of that increase based on the priority of a certain workflow in the queue of the server 104a. For example, if a computationally expensive job is third in the queue of the server 104a but the other two jobs ahead of the computationally expensive one do not require as much power, it would be inefficient to increase water flow to the server 104a immediately. In such embodiments, the delay module 748 determines an appropriate time to increase water flow through the valve 130 such that the server 104a is appropriately cooled during the computationally intensive job but that resources (i.e., pumps 138 are also conserved).

Figure 2:
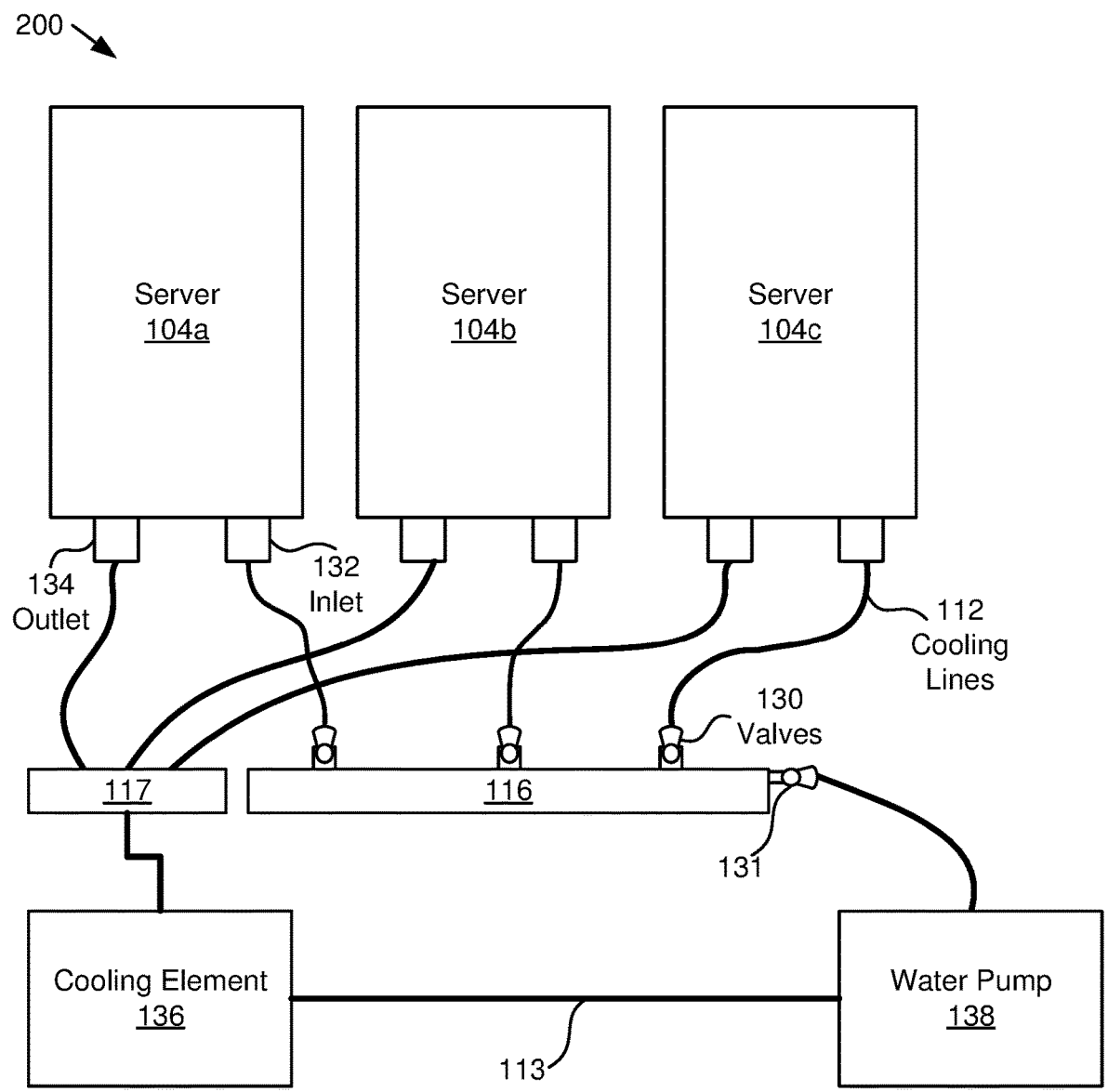
FIG. 2 is a schematic block diagram of a top view of a system for cooling servers, according to various embodiments.

FIG. 2 is a schematic block diagram illustrating a system 200 of cooling servers 104, according to various embodiments. The system 200 of FIG. 2 is an extension of the system 100 of FIG. 1 showing return lines. As illustrated in FIGS. 2 and 1, the system 200 includes a water supply, such as a water pump 138. To facilitate different rates of water flow and optimize cooling on a per-server basis, each rack 118 has a rack manifold 116 that is connected to a main manifold 126. The water pump 138 supplies water to the rack supply manifold 116. The main manifold 126 controls water flow to each rack 118. In some embodiments, the manifold 126 is a structure, junction point, or pipeline with taps to the various racks 118. For example, each valve 130 of the main manifold 126 controls water flow to a rack 118. As illustrated in FIG. 1, in some embodiments, the water pump 138 supplies water to the supply rack manifold 116 through a main manifold, such as main manifold 126 in FIG. 1. Valves 130 on the main manifold 126 control water flow to the rack manifold 116. Additionally or alternatively, as shown in FIG. 2, a valve 131 on the rack supply manifold 116 controls water flow from the water supply 138 to the rack supply manifold 116. In some embodiments, the supply valve 131 is at the water pump 138 and is used for maintenance.

The water pump 138 is connected to a cooling element 136 which brings the temperature of the water down to a desired temperature. As illustrated in FIG. 2, the cooling element 136 cools water that has already been used to cool servers 104 such that the water may be used again for additional cooling. After cooling the servers 104, the warm liquid is circulated through cooling lines 112 to a cooling element 136. In some embodiments, after the liquid is cooled again, it is circulated back to the water pump 138. In other embodiments, the liquid is circulated directly back to the servers 104 after being cooled. In some embodiments, the cooling lines 112 are integrated directly into a chassis of a server 104. For example, cool liquid is piped through the cooling lines 112 as shown in FIGS. 3-5. The cooling lines 112 run over and/or in proximity to components of the servers 104, such as the CPUs, GPUs, or memory. In some embodiments, the cooling lines 112 bring the cool liquid to cold plates or heat exchangers that sit directly next to these components.

In some embodiments, the servers 104a, ..., 104c are on a rack 118. In some embodiments, each rack 118 is a vertical stack of trays. Each tray includes a motherboard with one or more servers 104. For example, as shown in FIG. 3, a motherboard 336 includes two servers 104a and 104b.

Water flow to a rack 118 is adjusted by adjusting a valve 130 corresponding to the rack 118. For example, for water flow to the rack 118 to be increased, a valve 130 corresponding to that rack 118 is opened an amount commensurate with a desired increase in flow rate. For water flow to the rack 118 to be decreased, the valve 130 corresponding to that rack 118 is closed an amount commensurate with a desired decrease in flow rate. In some embodiments, the valves 130 for each rack 118 in the main manifold 126 are not included and pressure differentials based on demand in each rack 118 control water flow to each rack 118. In other embodiments, the valves 130 for each rack 118 in the main manifold 126 are included but are not controlled to manage flow rates but are instead used to shut off water to a rack 118 for service.

The rack supply manifold 116 controls water flow to individual servers 104 on the rack 118. The rack manifold 116 has multiple valves 130, each valve 130 corresponding to a server 104. For example, a valve 130 controls water flow to a server 104a. To cool a server 104a, the corresponding valve 130 is opened an amount to increase water flow to that server 104a. On the other hand, the corresponding valve 130 is closed an amount to decrease water flow to that server 104a. If the utilization of the server 104a increases but utilization of other servers 104b ... 104n on the rack 118 remains constant, increased water flow is optimal to cool the server 104a but not preferable for servers 104b, ... 104n. Thus, a valve 130 corresponding to the server 104a on the rack manifold 116 is adjusted without adjusting water flow to any of the other servers 104b ... 104n of the rack 118. In some embodiments, the rack supply manifold 116 is a rear door heat exchanger.

The rack supply manifold 116 includes multiple valves 130 connected to cooling lines 112. Each of these valves 130 controls water flow to a server 104a, ..., 104c. Each server 104a ... 104c includes an inlet 132 and an outlet 134. The cooling lines 112 run between the valve 130 and the inlet 132 of the corresponding server 104. In some embodiments, the cooling lines 112 cool the servers 104 as illustrated in any of FIGS. 3-5. Water that has run through a cooling loop of the server 104 then goes through the cooling line 112 and out of the server 104 via the server's outlet 134.

Embodiments of the present disclosure include adjusting a water flow rate to at least one of the servers 104a, 104b, 104c. In some embodiments, water flow is adjusted to a subset of the servers 104a, 104b, 104c and remains constant for another subset of the servers 104a, 104b, 104c. For example, increased utilization of servers 104a and 104c demands increased water flow to servers 104a and 104c. However, utilization of server 104b has either decreased or remained constant. Valves 130 are used to increase water flow to servers 104a and 104c while the water flow to sever 104b remains constant or decreases, depending on utilization of server 104b. Embodiments of the present disclosure allow for flow rates to be adjusted to groups of servers that are not consecutively positioned, such as servers 104a and 104c. For example, server 104a is in position u1 on the rack, and server 104c is in position u33 on the rack 118. In some embodiments, servers 104a and 104c are positioned on different racks 118.

In some embodiments, each of the outlets 134 of the servers 104 are connected to a return manifold 117 via the cooling lines 112. The return manifold 117 gathers the liquid that has cooled the servers 104. In some embodiments, the return manifold 117 allows this liquid to return to the cooling element 136 in a single line 113. While valves are not shown on the return manifold 117, in some embodiments, the return manifold 117 includes valves, such as manual valves, for on/off control for maintenance.

The servers 140 are mounted in vertical racks 118. In some embodiments, the servers 104 are mounted onto racks (e.g., rack 118 of Figure) via trays. In other embodiments, the servers 104 are attached directly to the rack 118. For example, the servers 104 have widths that are substantially equal to the width of the rack 118 and are bolted into the rack 118.

In some embodiments, the system 100 is designed to maintain a constant change in supply and return water temperatures for each server 104, rack of servers 104, and or component of servers 104. In current systems, water flow rates are adjusted to maintain uniform temperature differences throughout the system 100. The flow control apparatus 102 changes flow rates based on need at the servers 104 or components of servers 104. For example, in some embodiments, the water coming out of the supply manifold and through the cooling lines has an initial temperature of 25° C. The water temperature increases to 45° C. by the time it reaches the return manifold 117 due to the transfer of heat from the server(s) it cooled. In such an example, the change in temperature of the liquid is approximately 20° C. In some embodiments, the flow control apparatus 102 affects the cooling element 136 to cause the cooling element 136 to increase cooling as return water temperatures rise. For example, if a difference in measured supply and return temperatures is greater than 20° C. For a particular server 104a, the flow control apparatus 102 increases water flow to server 104a. For example, a valve 130 controlling water flow to that server 104a is adjusted. An aggregate of flow rates of servers 104 may increase water inlet temperature to the cooling element 136, which may in turn increase cooling of the water.

In some embodiments, temperature of supply liquid is maintained below a predetermined temperature limit. The cooling element 136 is adjusted to maintain water temperatures that are below that limit. For example, if the temperature of the supply liquid is above the predetermined limit, the cooling element 136 can work to bring that temperature below the limit.

Although not shown in FIG. 2, in some embodiments, the system 100 includes additional devices for obtaining measurements, such as sensors. Measurements from these sensors, in some embodiments, are analyzed by the flow control apparatus 102 and/or remote management server 122. The flow control apparatus 102 determines at least one of the following based on such measurements: temperature, predicted utilization, water flow rate, ideal water flow rate, predicted water flow rate, or any combination thereof. Such sensors include, for example, devices configured to measure at least one of the following: supply water temperature, return water temperature, server 104 component temperature, temperature of ambient air within the data center 120, temperature of a server 104, temperature of a component of a server, relative humidity within the data center 120, server power consumption, server 104 component power consumption, rack 118 power consumption, water flow rate to a server 104, water flow rate to a component of a server, water pressure in cooling lines 112, leakage of water from cooling lines 112, or any combination thereof. As shown in FIGS. 3-5, in some embodiments, each server 104 includes a server supply manifold 314 with valves 330 controlling flow to components of the server 104.

FIG. 3 is a schematic block diagram illustrating a system 300 for cooling components of servers 104, according to various embodiments. FIG. 3 illustrates an example of a motherboard 336 with CPUs 306 that include devices with different cooling requirements than the CPUs 306, according to various embodiments. In the embodiments of FIG. 3, the motherboard 336 includes two side-by-side servers 104a and 104b in a single rack-mounted tray. In addition to the CPUs 306, the motherboard 336 includes memory 308 and GPUs 310. The CPUs 306, memory 308, and GPUs 310 are each cooled by a separate single-phase cooling loop with cooling lines 312 depicted as black lines running between the CPUs 306, memory 308, and GPUs 310. The motherboard 336 is merely representative of other motherboards with one or more components with temperature sensitive requirements adjacent to other less sensitive components. Other motherboards 336 include multiple cooling loops split differently than the embodiments of FIG. 3.

An inlet 332 receives cool fluid and an outlet 334 outputs fluid that is heated after heat removal. Server supply manifold 314 receives the fluid and is configured to split the fluid into smaller streams. In some embodiments, cooling lines 312 are routed between memory 308, such as dual in-line memory modules ("DIMMs"). The server supply manifold 314 is positioned between the inlet portion 332 and the components of the servers 104a and 104b. The server supply manifold 314 includes several valves 330. Each valve 330 controls water flow to a component or group of related components of the servers 104a and 104b.

The cooling lines 312 are routed through the components that they cool and then connect to a server return manifold 315. This server return manifold 315 receives input from the several cooling lines 312 and then channels the water out and off the motherboard 336 in a single line. Positioning the supply manifold 314 and the return manifold 315 within the servers 104a and 104b allows for control of water flow to different server components without the need for multiple inlet ports 332 and/or multiple outlet ports 334.

Some embodiments include utilization of components of servers 104. For example, utilization of the CPUs 306, memory 308, and/or GPUs 310 is measured and/or determined based on communication between the flow control apparatus 102 and the server 104. Because each valve 330 on the server supply manifold 314 controls flow of water to individual components, water flow to components is adjusted individually based on utilization and/or predicted utilization. In some embodiments, the components are grouped into sub-systems of the server 104. For example, the server 104 includes a memory 308 subsystem of memory cards. In other embodiments, different types of components (e.g., CPU 306 and GPU 310) are grouped together in a sub-system. In such embodiments, the valves 330 control water flow to the subsystem rather than the individual components.

Embodiments include predicting utilization and/or adjusting water flow to individual components of servers 104 based on workflows. For example, Workflow 1 requires more power consumption from the GPU 310 (e.g., relatively higher GPU utilization) but less power consumption from the CPU 306 and memory 308 (e.g., relatively lower CPU and memory utilization). The flow control apparatus (e.g., apparatus 102, 600, or 700) determines that server 104 is running or will soon run Workflow 1 and can actuate adjusting the valves 330 to appropriately adjust water flow to different components. For example, if Workflow 1 is about to run, the flow control apparatus 102 actuates opening a valve 330 to increase water flow to the GPU 310. In some embodiments, Workflow 2 is next in the queue after Workflow 1. Workflow 2 requires more power consumption from the CPU 306 (e.g., relatively higher CPU utilization) but less from the GPU 310 and memory 308 (e.g., relatively lower GPU and memory utilization). In preparation for starting Workflow 2 or just after starting Workflow 2, the flow control apparatus 102 actuates the valves 330 controlling the water flow to the GPU 310 to adjust for a decreased water flow rate and/or actuates the valves 330 controlling water flow to the CPU 306 and memory 308 to adjust to an increased water flow rate.

Although FIG. 3 shows cooling lines 312 to cool CPUs 306, GPUs 310, and memory 308, embodiments of the present disclosure are not limited to these types of components. For example, embodiments of the present disclosure include valves 330 controlling water flow through cooling lines 312 to other types of server components, such as peripherical component interconnect expresses ("PCIe") and/or data storage separate from the memory 308.

FIG. 4 is a schematic block diagram of a system 400 for cooling components of a server 104a, according to various embodiments. In some embodiments, a server 104a contains components including but not limited to memory 408, CPU 406, and/or GPU 410. In some embodiments, the server 104 includes multiple components of memory 408, multiple CPUs 406, and/or multiple GPUs 410. For example, as illustrated in FIG. 4, a server 104a includes two GPUs 410, two CPUs 406, and two zones of memory 408.

The server 104a includes a server supply manifold 414 and a server return manifold 415. The server supply manifold 414 is connected to an inlet 432 of the server 104 through a cooling line 412. The server supply manifold 414 includes multiple valves 430 controlling water flow to various components (e.g., CPU 406, GPU 410, and/or memory 408). In some embodiments, each valve 430 controls water flow to a particular component. For example, as illustrated in FIG. 4, valve 430a controls water flow to the GPU 410. Thus, an apparatus such as the flow control apparatus 102 illustrated in FIG. 1 determines that utilization of the GPU 410 has increased or will increase and that flow to the GPU 410 should be increased for optimal cooling, the valve 430a is opened to increase water flow to the GPU 410. Since each of the valves 430 controls flow to a different component, flow to one component, such as the GPU 410, is adjusted without adjusting flow rates to other components of the server 104a.

In some embodiments, water flow to the server 104a is controlled and/or adjusted via a valve 130a, which is connected to a rack supply manifold 116. In such embodiments, water flow to the server 104a as a whole is adjusted, and water flow to the individual components of the server 104a is also adjusted (e.g., through valves 430 within the server 104, such as valve 430a).

Server 104a also includes a server return manifold 415 within the server 104a. The server return manifold 415 receives liquid that has been routed through the components of the server via the cooling lines 112. Through the return manifold 415, that water is then routed back to the outlet 434 of the server 104a in a single cooling line 112.

FIGS. 3 and 4 show memory 408 positioned towards the back of the server, GPUs 410 positioned towards the front of the server, and CPUs 406 in between. However, embodiments of the present disclosure are not so limited, and other arrangements of components of servers 104 are within the scope of this disclosure.

Although FIG. 4 shows a valve 130a controlling water flow to the server 104a from the rack supply manifold 116, embodiments of the present disclosure are not so limited. For example, FIG. 5 is a schematic block diagram of a system 500 for cooling components of a server 104a, according to various embodiments. As shown in FIG. 5, a single cooling line 512a runs from the rack supply manifold 116 to the server 104a without a main valve to the server 104, but has valves 530 to individual zones. As such, water flows from the rack supply manifold 116 to the server 104a without need for adjustment through a main valve, but individual valves 530 to the zones are adjusted. While FIGS. 4 and 5 depict three zones per side of a server 140a that each include a GPU 410, 510 in one zone, a CPU 406, 506 in a second zone, and memory 408, 508 in a third zone, the embodiments described herein are also applicable to servers 104 with zones that may include input/output cards, storage media, or other larger cold plates attached to a motherboard. One of skill in the art will recognize other components of a server 104 to include in a zone and other zone divisions.

Figure 8:
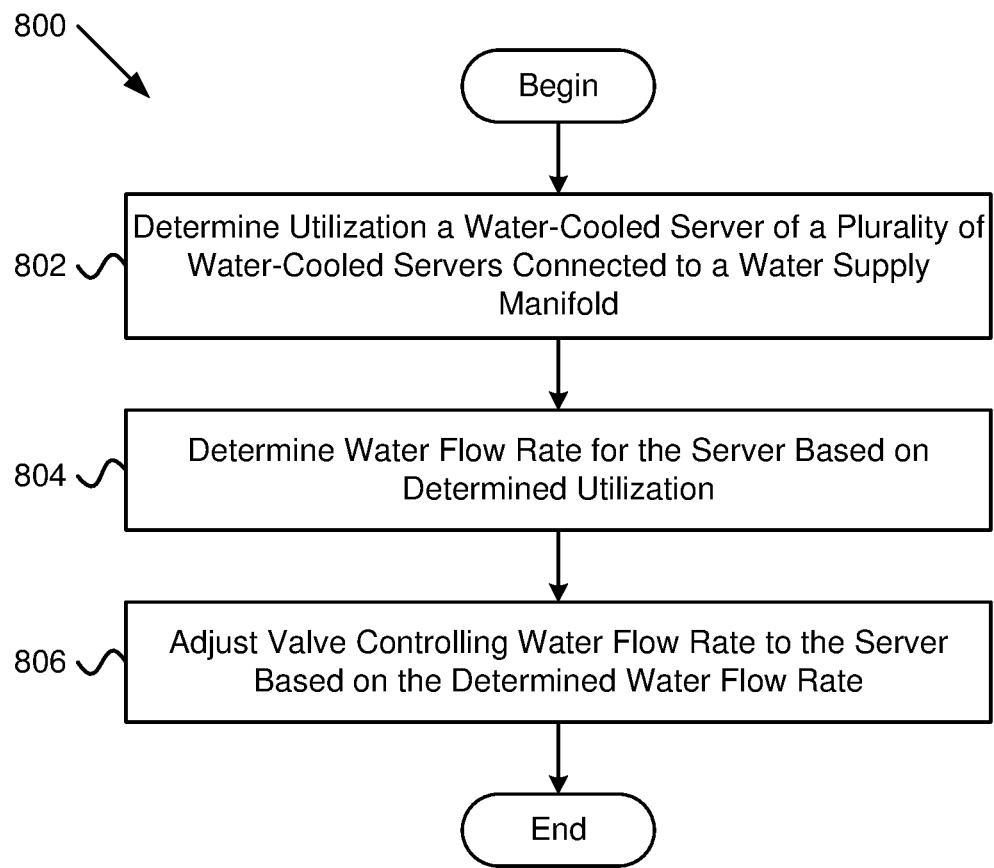
FIG. 8 is a schematic flow chart diagram of a method for cooling servers, according to various embodiments.

FIG. 8 is a schematic flow chart diagram illustrating a method 800 for cooling servers 104, according to various embodiments. The method 800 begins and determines 802 a utilization of a server 104. The server 104 is water-cooled and is one of a plurality of water-cooled servers (e.g., server 104a, . . . , 104n) that are connected to a water supply manifold (e.g., rack manifold 116 and/or main manifold 126). In some embodiments, determining utilization of a server 104 includes determining a utilization of a component of the server 104. In some examples, determining a utilization of a server 104 includes determining a utilization of a CPU 306, memory 308, and/or GPU 310 of a server 104. In some embodiments, determining utilization of a server 104 further includes predicting utilization of a server 104.

The method 800 determines 804 a water flow rate to cool the server 104. Water flow rate is determined based at least in part on the determined utilization of the server 104. In some embodiments, determining the water flow rate to cool the server 104 includes determining a predicted water flow rate to cool the server 104. The predicted water flow rate is based at least in part on the predicted future utilization.

The method 800 adjusts 806 a water flow rate to the server 104 via a valve 130 controlling the water flow rate to the server 104, and the method 800 ends. This adjustment is made based at least in part on the determined water flow rate to cool the server 104. In some embodiments, the method 800 adjusts 806 the water flow rate based at least on a predicted water flow rate. In some embodiments, the water flow rate to the server 104 is adjusted at a time of a predicted future utilization. For example, if it is predicted that the utilization will increase in five minutes, the valve is opened to increase water flow in five minutes from the determination. In various embodiments, all or a portion of the method 800 is implemented using the utilization module 602, the flow rate module 604, and/or the adjustment module 606.

Figure 9:
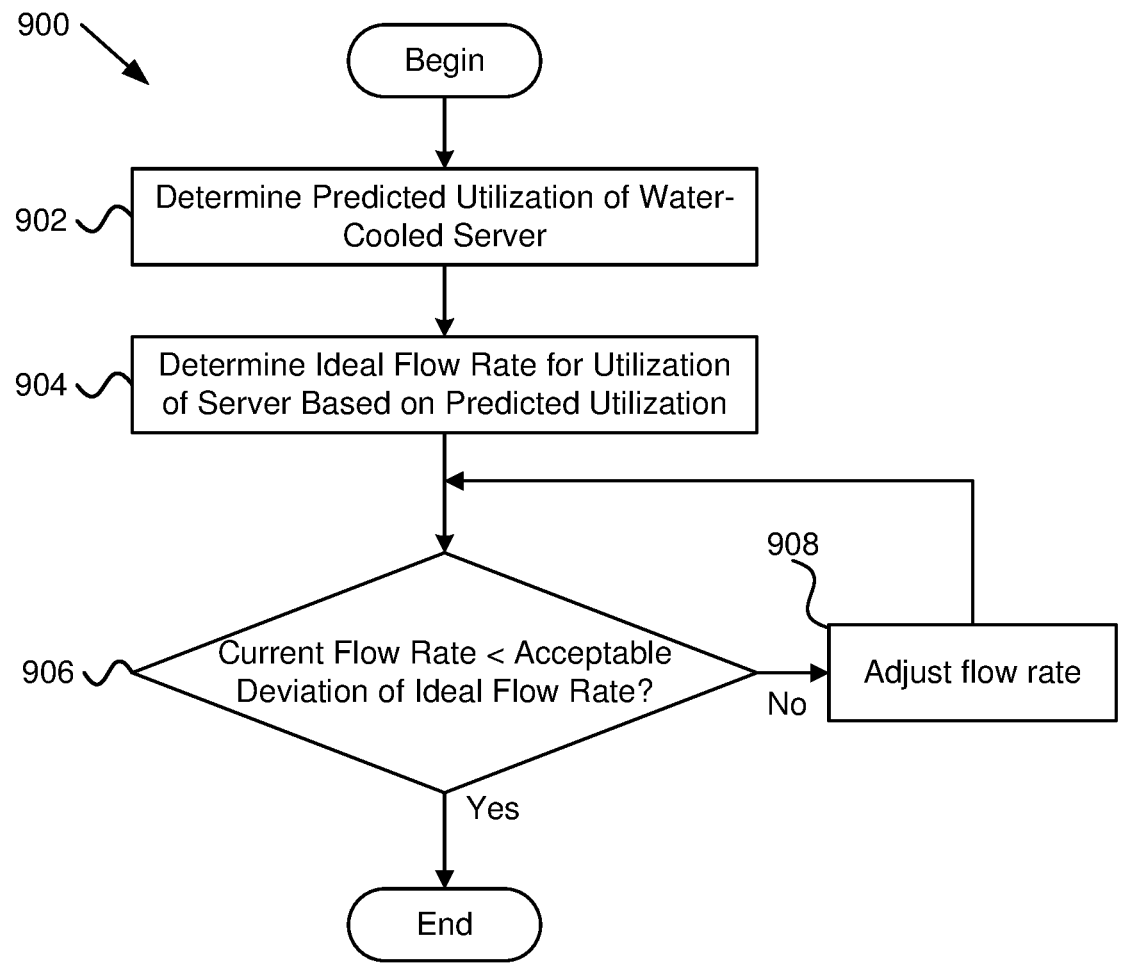
FIG. 9 is a schematic flow chart diagram of a method for cooling servers, according to various embodiments.

FIG. 9 is a schematic flow chart diagram illustrating another method 900 for cooling servers, according to various embodiments. The method 900 begins and determines 902 a predicted utilization of a water-cooled server (e.g., server 104). In some embodiments, determining 902 a predicted utilization of a water-cooled server 104 includes determining a predicted utilization of one or more components (e.g., CPU 106, memory 108, and/or GPU 110) of the server 104. The method 900 determines 904 an ideal water flow rate of water to the server 104 based on the predicted utilization predicted. Determining 904 an ideal water flow rate to the server 104 includes, in some embodiments, determining a water flow rate to maximize overall efficiency of a system 100.

The method 900 determines 906 if a current flow rate of water to the server 104 is within an acceptable deviation from the ideal flow rate. If the method 900 determines 906 that the current flow rate is not within an acceptable deviation from the ideal flow rate, the method 900 adjusts 908 the flow rate to the server 104 and returns and determines 906 if the current flow rate is within the acceptable deviation from the ideal flow rate. If the method 900 determines 906 that the current flow rate is within the acceptable deviation from the ideal flow rate, the method 900 ends.

In some examples, the ideal flow rate to a water-cooled server 104 may be approximately 20 liters per minute ("1 pm"), with an acceptable deviation of 5%, or +11 pm. If the water flow rate is measured to be approximately 19 1 pm, the method 900 ends. If the water flow rate is approximately 17.5 1 pm, the method 900 adjusts 908 the water flow rate to increase water flow to the server 104. In various embodiments, all or a portion of the method 800 is implemented using the utilization module 602, the flow rate module 604, the adjustment module 606, the prediction module 746, the delay module 748, the future flow rate module 750, the utilization-water flow model module 752, and/or the future events module 754.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:
   determining, using a processor, a utilization of a server, wherein the server is water-cooled and comprises one of a plurality of servers, wherein each server of the plurality of servers is water-cooled and wherein each server of the plurality of servers is connected to a water supply manifold by one or more valves;
   determining, using the processor and based at least in part on the determined utilization of the server, a water flow rate to cool the server; and
   adjusting, using the processors and based at least in part on the determined water flow rate to cool the server, a water flow rate to the server via a valve controlling the water flow rate to the server.

2. The method of claim 1, wherein:
   determining the utilization of the server comprises predicting a future utilization of the server;
   determining the water flow rate to cool the server comprises determining a predicted water flow rate to cool the server based at least in part on the predicted future utilization; and
   adjusting the water flow rate to the server comprises adjusting the water flow rate to the server via the valve controlling the water flow rate to the server based at least in part on the determined predicted water flow rate.

3. The method of claim 2, wherein the water flow rate to the server is adjusted at a time of the predicted future utilization.

4. The method of claim 2, wherein predicting the future utilization is based at least in part on the determined utilization, a future event affecting utilization, and/or a utilization-water flow model for the plurality of servers.

5. The method of claim 4, wherein the utilization-water flow model is derived through machine learning and is based at least in part on:
   data received from a number of the plurality of servers, the data comprising a temperature of each server of the number of the plurality of servers, a utilization of each server of the number of the plurality of servers, and/or a water flow rate to each server of the number of the plurality of servers;
   a correlation between the temperature of each server of the number of the plurality of servers and the utilization of each server of the number of the plurality of servers; and
   a correlation between the utilization of each server of the number of the plurality of servers and the water flow rate to each server of the number of the plurality of servers.

6. The method of claim 1, wherein:
   determining the utilization of the server further comprises determining a utilization of a component of the server;
   determining the water flow rate to cool the server further comprises determining, based at least in part on the determined utilization of the component, a water flow rate to cool the component; and
   adjusting the water flow rate to the server further comprises adjusting, based at least in part on the water flow rate to cool the component, a water flow rate to the component via a valve controlling the water flow rate to the component.

7. The method of claim 1, wherein:
   the server and a number of the plurality of servers are positioned on a rack-mounted tray; and
   the water supply manifold comprises one or more cooling lines to each server of the number of the plurality of servers, wherein each cooling line of the one or more cooling lines comprises a valve of the one or more valves configured to adjust a water flow rate through the cooling line to a corresponding server.

8. The method of claim 1, wherein the utilization of the server comprises a proportion of time during which the server is in use over a period of time.

9. An apparatus comprising:
   a water supply manifold connected to a plurality of servers, wherein each server of the plurality of servers is water-cooled and wherein each server is connected to the water supply manifold by one or more valves;
   a processor; and
   non-transitory computer readable storage media storing code, the code being executable by the processor to perform operations comprising:

determining a utilization of a server of the plurality of servers;

determining, based at least in part on the determined utilization of the server, a water flow rate to cool the server; and adjusting, based at least in part on the determined water flow rate to cool the server, a water flow rate to the server via a valve of the one or more valves of the water supply manifold controlling the water flow rate to the server.

10. The apparatus of claim 9, the operations further comprising:

predicting a future utilization of the server;

determining, based at least in part on the predicted future utilization, a predicted water flow rate to cool the server; and adjusting, based at least in part on the determined predicted water flow rate, the water flow rate to the server via the valve controlling the water flow rate to the server.

11. The apparatus of claim 10, the operations further comprising adjusting the water flow rate to the server at a time of the predicted future utilization.

12. The apparatus of claim 10, wherein predicting the future utilization is based at least in part on the determined utilization, a future event affecting utilization, and/or a utilization-water flow model for the plurality of servers.

13. The apparatus of claim 12, wherein the utilization-water flow model is derived through machine learning and is based at least in part on at least one of:

data received from a number of the plurality of servers, the data comprising a temperature of each server of the number of the plurality of servers, a utilization of each server of the number of the plurality of servers, and/or a water flow rate to each server of the number of the plurality of servers;

a correlation between the temperature of each server of the plurality of servers and the utilization of each server of the plurality of servers; and/or a correlation between the utilization of each server of the plurality of servers and the water flow rate to each server of the plurality of servers.

14. The apparatus of claim 9, wherein:

determining the utilization of the server further comprises determining a utilization of a component of the server;

determining the water flow rate to cool the server further comprises determining, based at least in part on the determined utilization of the component, a water flow rate to cool the component; and adjusting the water flow rate to the server further comprises adjusting, based at least in part on the water flow rate to cool the component, a water flow rate to the component via a valve controlling the water flow rate to the component.

15. The apparatus of claim 9, wherein:

the server and a number of the plurality of servers are positioned on a rack-mounted tray; and the water supply manifold comprises one or more cooling lines to each server of the number of the plurality of servers, wherein each cooling line of the one or more cooling lines comprises a valve of the one or more valves configured to adjust a water flow rate through the cooling line to a corresponding server.

16. A system comprising:

a plurality of servers, wherein each server of the plurality of servers is water-cooled;

a water supply manifold connected to the plurality of servers;

a number of valves, wherein each valve of the number of valves controls a water flow rate to at least one server of the plurality of servers;

a processor; and non-transitory computer readable storage media storing code, the code being executable by the processor to perform operations comprising:

determining a utilization of a server of the plurality of servers;

determining, based at least in part on the determined utilization of the server, a water flow rate to cool the server; and actuating the valve controlling the water flow rate to the server to adjust, based at least in part on the determined water flow rate to cool the server, the water flow rate to the server.

17. The system of claim 16, wherein:

determining the utilization of the server further comprises predicting a future utilization of the server;

determining the water flow rate to cool the server further comprises determining a predicted water flow rate to cool the server based at least in part on the predicted future utilization; and adjusting the water flow rate to the server further comprises adjusting predicted water flow rate the water flow rate to the server via the valve controlling the water flow rate to the server based on the determined predicted water flow rate.

18. The system of claim 17, wherein predicting the future utilization is based at least in part on the determined utilization, a future event affecting utilization, and/or a utilization-water flow model for the plurality of servers.

19. The system of claim 16, further comprising an additional number of valves, wherein each valve of the additional number of valves controls a water flow rate to a component of at least one server of the plurality of servers.

20. The system of claim 16, wherein:

the server and a number of the plurality of servers are positioned on a rack-mounted tray; and the water supply manifold comprises one or more cooling lines to each server of the number of the plurality of servers, wherein each cooling line of the one or more cooling lines comprises a valve of the number of valves configured to adjust a water flow rate through the cooling line to a corresponding server.

* * * * *